United States Patent
Lawrence

(10) Patent No.: US 10,915,339 B2
(45) Date of Patent: *Feb. 9, 2021

(54) COMPUTER ARCHITECTURE FOR EMULATING A CORRELITHM OBJECT PROCESSING SYSTEM THAT PLACES PORTIONS OF A MAPPING TABLE IN A DISTRIBUTED NODE NETWORK

(71) Applicant: BANK OF AMERICA CORPORATION, Charlotte, NC (US)

(72) Inventor: Patrick N. Lawrence, Plano, TX (US)

(73) Assignee: Bank of America Corporation, Charlotte, NC (US)

( * ) Notice: Subject to any disclaimer, the term of this patent is extended or adjusted under 35 U.S.C. 154(b) by 370 days.

This patent is subject to a terminal disclaimer.

(21) Appl. No.: 15/936,002

(22) Filed: Mar. 26, 2018

(65) Prior Publication Data
US 2019/0294456 A1    Sep. 26, 2019

(51) Int. Cl.
*G06F 9/455* (2018.01)
*G06F 30/13* (2020.01)
*G06F 17/40* (2006.01)

(52) U.S. Cl.
CPC .......... *G06F 9/45508* (2013.01); *G06F 17/40* (2013.01); *G06F 30/13* (2020.01)

(58) Field of Classification Search
CPC ...... G06F 30/13; G06F 16/9024; G06F 40/05; G06F 16/152; G06F 17/40; G06F 21/606; G06F 9/45508; G06F 16/2462; A63F 13/30; H04N 5/782; H04N 21/4524; G06N 5/022; G06N 20/20; G06N 20/00; C12Q 1/6886; G01C 2/20; G06K 9/00536
See application file for complete search history.

(56) References Cited

U.S. PATENT DOCUMENTS

| | | | |
|---|---|---|---|
| 5,353,243 A | * | 10/1994 | Read .................. G06F 30/33 703/2 |
| 5,946,673 A | | 8/1999 | Francone et al. |
| 6,167,391 A | | 12/2000 | Lawrence |
| 6,941,287 B1 | | 9/2005 | Vaidvanathen et al. |

(Continued)

OTHER PUBLICATIONS

Meersman, R. et al., "On the Move to Meaningful Internet Systems 2005: CoopIS, DOA and ODBASE," OTM Confederated International Conferences CoopIS, DOA and ODBASE Oct. 2005 Agia Napa, Cyprus, Proceedings, Part I, Oct. 31-Nov. 4, 2005. pp. 763-779.

Lawrence, P. N., "Correlithm Object Technology," Apr. 2004, 229 pages.

Lawrence, P. N., "Computer Architecture for Emulating a Correlithm Object Processing System that Places Portions of Correlithm Objects and Portions of a Mapping Table in a Distributed Node Network," U.S. Appl. No. 15/935,644, filed Mar. 26, 2018, 98 pages.

(Continued)

*Primary Examiner* — Kandasamy Thangavelu
(74) *Attorney, Agent, or Firm* — Michael A. Springs

(57) ABSTRACT

A distributed node network to emulate a correlithm object processing system includes a distribution node, a first calculation node, and a second calculation node communicatively coupled to each other. The distribution node is configured to divide a correlithm object mapping table into at least a first portion and a second portion. The first portion of the mapping table includes a first subset of the source correlithm objects and their corresponding target correlithm objects. The second portion of the mapping table includes a second subset of the source correlithm objects and their corresponding target correlithm objects. The first and second calculation nodes store the first and second portions of the correlithm object mapping table, respectively.

17 Claims, 18 Drawing Sheets

(56) References Cited

U.S. PATENT DOCUMENTS

| | | | |
|---|---|---|---|
| 6,943,686 B2 | 9/2005 | Allen | |
| 6,947,913 B1 | 9/2005 | Lawrence | |
| 7,015,835 B2 | 3/2006 | Lawrence et al. | |
| 7,031,969 B2 | 4/2006 | Lawrence et al. | |
| 7,246,129 B2 | 7/2007 | Lawrence et al. | |
| 7,310,622 B2 | 12/2007 | Lawrence et al. | |
| 7,349,928 B2 | 3/2008 | Lawrence et al. | |
| 8,206,222 B2 * | 6/2012 | Shuster | A63F 13/30 463/42 |
| 9,607,104 B1 * | 3/2017 | Turner | G06F 16/9024 |
| 2006/0200253 A1 * | 9/2006 | Hoffberg | H04N 5/782 700/19 |
| 2010/0036192 A1 * | 2/2010 | Yao | G16H 70/20 600/33 |
| 2011/0047158 A1 * | 2/2011 | Cohen | G06F 21/606 707/737 |
| 2011/0099200 A1 * | 4/2011 | Blount | G06F 16/152 707/770 |
| 2013/0013661 A1 * | 1/2013 | Inakoshi | G01C 21/20 708/442 |
| 2013/0182002 A1 * | 7/2013 | Macciola | G06F 17/40 345/589 |
| 2016/0062954 A1 * | 3/2016 | Ruff | G06F 40/205 715/249 |
| 2017/0022571 A1 * | 1/2017 | Malafa | C12Q 1/6886 |
| 2017/0262552 A1 * | 9/2017 | Noma | G06N 20/00 |
| 2018/0089531 A1 * | 3/2018 | Geva | G06K 9/00536 |
| 2019/0130248 A1 * | 5/2019 | Zhong | G06F 16/2462 |
| 2019/0174194 A1 * | 6/2019 | Wirasinghe | H04N 21/4524 |

OTHER PUBLICATIONS

Lawrence, P. N., "Computer Architecture for Emulating a Correlithm Object Processing System that Uses Potions of Correlithm Objects and Protions of a Mapping Table in a Distributed Node Network," U.S. Appl. No. 15/935,822, filed Mar. 26, 2018, 102 pages.

Lawrence, P. N., "Computer Architecture for Emulating a Correlithm Object Processing System that Places Portions of Correlithm Objects in a Distributed Node Network," U.S. Appl. No. 15/935,915, filed Mar. 26, 2018, 97 pages.

Lawrence, P. N., "Computer Architecture for Emulating a Correlithm Object Processing System that Uses Portions of a Mapping Table in a Distributed Node Network," U.S. Appl. No. 15/936,063, filed Mar. 26, 2018, 101 pages.

Lawrence, P. N., "Computer Architecture for Emulating a Correlithm Object Processing System that Places Multiple Correlithm Objects in a Distributed Node Network," U.S. Appl. No. 15/936,105, filed Mar. 26, 2018, 97 pages.

Lawrence, P. N., "Computer Architecture for Emulating a Correlithm Object Processing System that Uses Portions of a Correlithm Objects in a Distributed Node Network," U.S. Appl. No. 15/936,135, filed Mar. 26, 2018, 100 pages.

Lawrence, P. N., "Computer Architecture for Emulating a Correlithm Object Processing System that Uses Multiple Correlithm Objects in a Distributed Node Network," U.S. Appl. No. 15/936,173, filed Mar. 26, 2018, 103 pages.

* cited by examiner

COMPUTER ARCHITECTURE FOR EMULATING A CORRELITHM OBJECT PROCESSING SYSTEM THAT PLACES PORTIONS OF A MAPPING TABLE IN A DISTRIBUTED NODE NETWORK

TECHNICAL FIELD

The present disclosure relates generally to computer architectures for emulating a processing system, and more specifically to computer architectures for emulating a correlithm object processing system.

BACKGROUND

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many security applications such as face recognition, voice recognition, and fraud detection.

Thus, it is desirable to provide a solution that allows computing systems to efficiently determine how similar different data samples are to each other and to perform operations based on their similarity.

SUMMARY

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many applications such as security application (e.g. face recognition, voice recognition, and fraud detection).

The system described in the present application provides a technical solution that enables the system to efficiently determine how similar different objects are to each other and to perform operations based on their similarity. In contrast to conventional systems, the system uses an unconventional configuration to perform various operations using categorical numbers and geometric objects, also referred to as correlithm objects, instead of ordinal numbers. Using categorical numbers and correlithm objects on a conventional device involves changing the traditional operation of the computer to support representing and manipulating concepts as correlithm objects. A device or system may be configured to implement or emulate a special purpose computing device capable of performing operations using correlithm objects. Implementing or emulating a correlithm object processing system improves the operation of a device by enabling the device to perform non-binary comparisons (i.e. match or no match) between different data samples. This enables the device to quantify a degree of similarity between different data samples. This increases the flexibility of the device to work with data samples having different data types and/or formats, and also increases the speed and performance of the device when performing operations using data samples. These technical advantages and other improvements to the device are described in more detail throughout the disclosure.

In one embodiment, the system is configured to use binary integers as categorical numbers rather than ordinal numbers which enables the system to determine how similar a data sample is to other data samples. Categorical numbers provide information about similar or dissimilar different data samples are from each other. For example, categorical numbers can be used in facial recognition applications to represent different images of faces and/or features of the faces. The system provides a technical advantage by allowing the system to assign correlithm objects represented by categorical numbers to different data samples based on how similar they are to other data samples. As an example, the system is able to assign correlithm objects to different images of people such that the correlithm objects can be directly used to determine how similar the people in the images are to each other. In other words, the system is able to use correlithm objects in facial recognition applications to quickly determine whether a captured image of a person matches any previously stored images without relying on conventional signal processing techniques.

Correlithm object processing systems use new types of data structures called correlithm objects that improve the way a device operates, for example, by enabling the device to perform non-binary data set comparisons and to quantify the similarity between different data samples. Correlithm objects are data structures designed to improve the way a device stores, retrieves, and compares data samples in memory. Correlithm objects also provide a data structure that is independent of the data type and format of the data samples they represent. Correlithm objects allow data samples to be directly compared regardless of their original data type and/or format.

A correlithm object processing system uses a combination of a sensor table, a node table, and/or an actor table to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures.

In addition, correlithm object processing system uses a combination of a sensor table, a node table, and/or an actor table to provide a particular manner for transforming data samples between ordinal number representations and correlithm objects in a correlithm object domain. Transforming data samples between ordinal number representations and correlithm objects involves fundamentally changing the data type of data samples between an ordinal number system and a categorical number system to achieve the previously described benefits of the correlithm object processing system.

Using correlithm objects allows the system or device to compare data samples (e.g. images) even when the input data sample does not exactly match any known or previously stored input values. For example, an input data sample that is an image may have different lighting conditions than the previously stored images. The differences in lighting conditions can make images of the same person appear different from each other. The device uses an unconventional configuration that implements a correlithm object processing system that uses the distance between the data samples which are represented as correlithm objects and other known data samples to determine whether the input data sample matches or is similar to the other known data samples. Implementing a correlithm object processing system fundamentally changes the device and the traditional data processing paradigm. Implementing the correlithm object processing system improves the operation of the device by enabling the device to perform non-binary comparisons of data samples. In other words, the device is able to determine how similar the data samples are to each other even when the data samples are not exact matches. In addition, the device is able to quantify how similar data samples are to one another. The ability to determine how similar data samples are to each other is unique and distinct from conventional computers that can only perform binary comparisons to identify exact matches.

The problems associated with comparing data sets and identifying matches based on the comparison are problems necessarily rooted in computer technologies. As described above, conventional systems are limited to a binary comparison that can only determine whether an exact match is found. Emulating a correlithm object processing system provides a technical solution that addresses problems associated with comparing data sets and identifying matches. Using correlithm objects to represent data samples fundamentally changes the operation of a device and how the device views data samples. By implementing a correlithm object processing system, the device can determine the distance between the data samples and other known data samples to determine whether the input data sample matches or is similar to the other known data samples. In addition, the device is able to determine a degree of similarity that quantifies how similar different data samples are to one another.

In one embodiment, a node is generally configured to receive an input correlithm object, identify the source correlithm object that most closely matches the input correlithm object, and output the target correlithm object corresponding to the identified source correlithm object. Finding the source correlithm object that most closely matches the input correlithm object may involve computing the n-dimensional distance (e.g., Hamming distance, Minkowski distance, or other suitable distance) between the input correlithm object and each of the source correlithm objects, and identifying the source correlithm object that results in the smallest n-dimensional distance calculation. Performing this distance calculation serially for a relatively large number of source correlithm objects in a relatively large correlithm object mapping table can be time and resource consuming, which can create bottlenecks in many aspects of a correlithm object processing system. The present disclosure provides a technical solution whereby the n-dimensional distance calculation is performed using parallel processing techniques implemented by calculation nodes, and a resolution node, as described in greater detail below.

The system is configured to implement parallel processing using groups of nodes that can execute simultaneously on different processors or servers associated with the same or different computers. In this way, the described systems can leverage multi-core, multi-threaded and multi-processor computers having multiple processing elements within a single machine; cluster computing (composed of multiple standalone machines connected by a network); massively parallel processors (a single computer with many networked processors); symmetric multiprocessors (a computer system with multiple identical processors that share memory and connect via a bus); and grid computing (computers communicating over the Internet to work on a given problem), among others. Performing parallel processing increases the speed and efficiency of calculating n-dimensional distances between input correlithm objects and source correlithm objects of a mapping table, among other tasks. This reduces bottlenecks in the network and in the overall correlithm object processing systems. This increases the functionality of the devices that implement the correlithm object processing systems, and thereby improves their operation.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
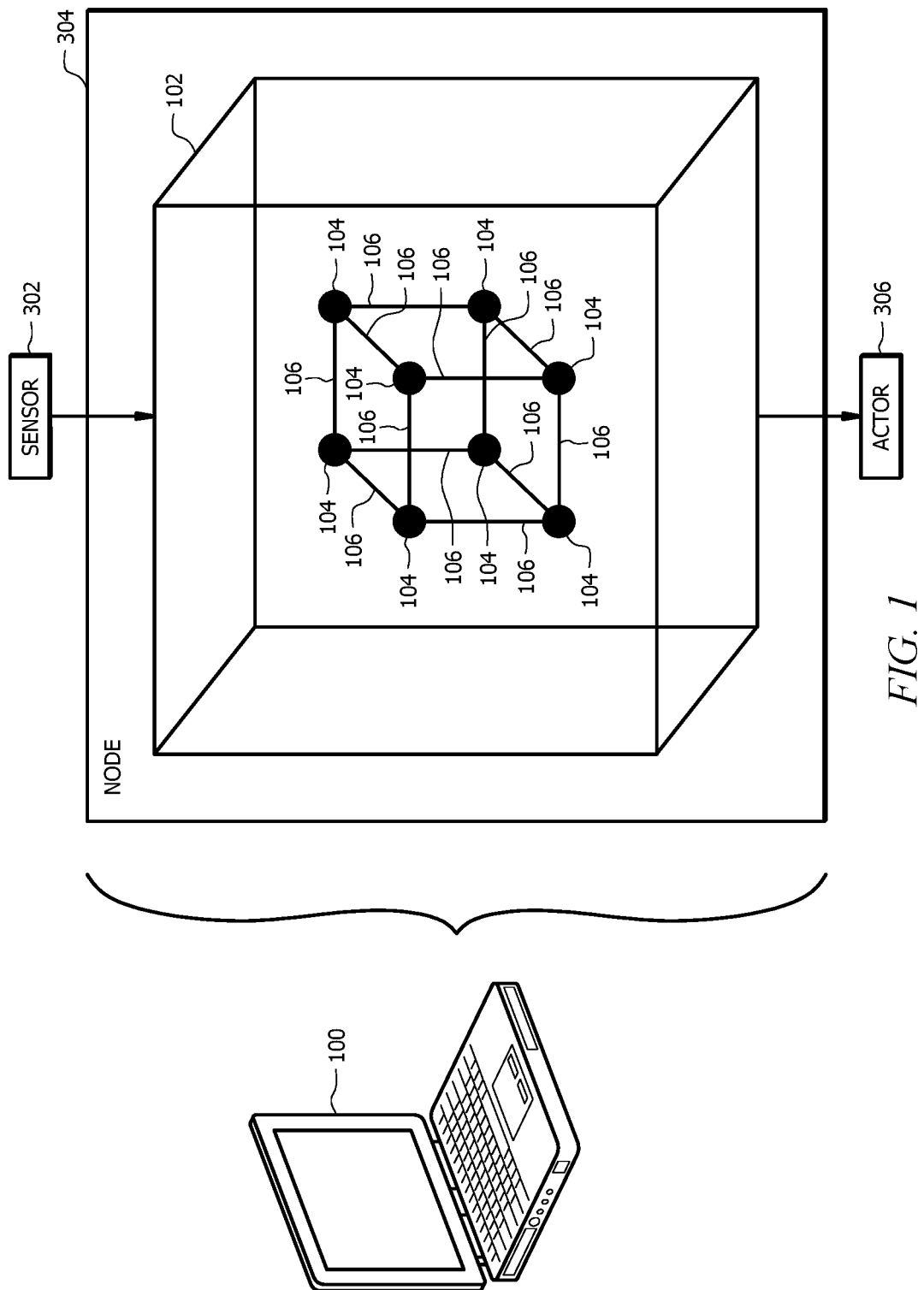
FIG. 1 is a schematic view of an embodiment of a special purpose computer implementing correlithm objects in an n-dimensional space.

FIGS. 1-5 describe various embodiments of how a correlithm object processing system may be implemented or emulated in hardware, such as a special purpose computer. FIG. 1 is a schematic view of an embodiment of a user device 100 implementing correlithm objects 104 in an n-dimensional space 102. Examples of user devices 100 include, but are not limited to, desktop computers, mobile phones, tablet computers, laptop computers, or other special purpose computer platform. The user device 100 is configured to implement or emulate a correlithm object processing system that uses categorical numbers to represent data samples as correlithm objects 104 in a high-dimensional space 102, for example a high-dimensional binary cube. Additional information about the correlithm object processing system is described in FIG. 3. Additional information about configuring the user device 100 to implement or emulate a correlithm object processing system is described in FIG. 5.

Conventional computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations. Ordinal based number systems only provide information about the sequence order of the numbers themselves based on their numeric values. Ordinal numbers do not provide any information about any other types of relationships for the data being represented by the numeric values, such as similarity. For example, when a conventional computer uses ordinal numbers to represent data samples (e.g. images or audio signals), different data samples are represented by different numeric values. The different numeric values do not provide any information about how similar or dissimilar one data sample is from another. In other words, conventional computers are only able to make binary comparisons of data samples which only results in determining whether the data samples match or do not match. Unless there is an exact match in ordinal number values, conventional systems are unable to tell if a data sample matches or is similar to any other data samples. As a result, conventional computers are unable to use ordinal numbers by themselves for determining similarity between different data samples, and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system.

In contrast to conventional systems, the user device 100 operates as a special purpose machine for implementing or emulating a correlithm object processing system. Implementing or emulating a correlithm object processing system improves the operation of the user device 100 by enabling the user device 100 to perform non-binary comparisons (i.e. match or no match) between different data samples. This enables the user device 100 to quantify a degree of similarity between different data samples. This increases the flexibility of the user device 100 to work with data samples having different data types and/or formats, and also increases the speed and performance of the user device 100 when performing operations using data samples. These improvements and other benefits to the user device 100 are described in more detail below and throughout the disclosure.

For example, the user device 100 employs the correlithm object processing system to allow the user device 100 to compare data samples even when the input data sample does not exactly match any known or previously stored input values. Implementing a correlithm object processing system fundamentally changes the user device 100 and the traditional data processing paradigm. Implementing the correlithm object processing system improves the operation of the user device 100 by enabling the user device 100 to perform non-binary comparisons of data samples. In other words, the user device 100 is able to determine how similar the data samples are to each other even when the data samples are not exact matches. In addition, the user device 100 is able to quantify how similar data samples are to one another. The ability to determine how similar data samples are to each others is unique and distinct from conventional computers that can only perform binary comparisons to identify exact matches.

The user device's 100 ability to perform non-binary comparisons of data samples also fundamentally changes traditional data searching paradigms. For example, conventional search engines rely on finding exact matches or exact partial matches of search tokens to identify related data samples. For instance, conventional text-based search engines are limited to finding related data samples that have text that exactly matches other data samples. These search engines only provide a binary result that identifies whether or not an exact match was found based on the search token. Implementing the correlithm object processing system improves the operation of the user device 100 by enabling the user device 100 to identify related data samples based on how similar the search token is to other data sample. These improvements result in increased flexibility and faster search time when using a correlithm object processing system. The ability to identify similarities between data samples expands the capabilities of a search engine to include data samples that may not have an exact match with a search token but are still related and similar in some aspects. The user device 100 is also able to quantify how similar data samples are to each other based on characteristics besides exact matches to the search token. Implementing the correlithm object processing system involves operating the user device 100 in an unconventional manner to achieve these technological improvements as well as other benefits described below for the user device 100.

Computing devices typically rely on the ability to compare data sets (e.g. data samples) to one another for processing. For example, in security or authentication applications a computing device is configured to compare an input of an unknown person to a data set of known people (or biometric information associated with these people). The problems associated with comparing data sets and identifying matches based on the comparison are problems necessarily rooted in computer technologies. As described above, conventional systems are limited to a binary comparison that can only determine whether an exact match is found. As an example, an input data sample that is an image of a person may have different lighting conditions than previously stored images. In this example, different lighting conditions can make images of the same person appear different from each other. Conventional computers are unable to distinguish between two images of the same person with different lighting conditions and two images of two different people without complicated signal processing. In both of these cases, conventional computers can only determine that the images are different. This is because conventional computers rely on manipulating ordinal numbers for processing.

In contrast, the user device 100 uses an unconventional configuration that uses correlithm objects to represent data samples. Using correlithm objects to represent data samples fundamentally changes the operation of the user device 100 and how the device views data samples. By implementing a correlithm object processing system, the user device 100 can determine the distance between the data samples and other known data samples to determine whether the input data sample matches or is similar to the other known data samples, as explained in detail below. Unlike the conventional computers described in the previous example, the user device 100 is able to distinguish between two images of the same person with different lighting conditions and two images of two different people by using correlithm objects 104. Correlithm objects allow the user device 100 to determine whether there are any similarities between data samples, such as between two images that are different from each other in some respects but similar in other respects. For example, the user device 100 is able to determine that despite different lighting conditions, the same person is present in both images.

In addition, the user device 100 is able to determine a degree of similarity that quantifies how similar different data samples are to one another. Implementing a correlithm object processing system in the user device 100 improves the operation of the user device 100 when comparing data sets and identifying matches by allowing the user device 100 to perform non-binary comparisons between data sets and to quantify the similarity between different data samples. In addition, using a correlithm object processing system results in increased flexibility and faster search times when comparing data samples or data sets. Thus, implementing a correlithm object processing system in the user device 100 provides a technical solution to a problem necessarily rooted in computer technologies.

The ability to implement a correlithm object processing system provides a technical advantage by allowing the system to identify and compare data samples regardless of whether an exact match has been previous observed or stored. In other words, using the correlithm object processing system the user device 100 is able to identify similar data samples to an input data sample in the absence of an exact match. This functionality is unique and distinct from conventional computers that can only identify data samples with exact matches.

Examples of data samples include, but are not limited to, images, files, text, audio signals, biometric signals, electric signals, or any other suitable type of data. A correlithm object 104 is a point in the n-dimensional space 102, sometimes called an "n-space." The value of represents the number of dimensions of the space. For example, an n-dimensional space 102 may be a 3-dimensional space, a 50-dimensional space, a 100-dimensional space, or any other suitable dimension space. The number of dimensions depends on its ability to support certain statistical tests, such as the distances between pairs of randomly chosen points in the space approximating a normal distribution. In some embodiments, increasing the number of dimensions in the n-dimensional space 102 modifies the statistical properties of the system to provide improved results. Increasing the number of dimensions increases the probability that a correlithm object 104 is similar to other adjacent correlithm objects 104. In other words, increasing the number of dimensions increases the correlation between how close a pair of correlithm objects 104 are to each other and how similar the correlithm objects 104 are to each other.

Correlithm object processing systems use new types of data structures called correlithm objects 104 that improve the way a device operates, for example, by enabling the device to perform non-binary data set comparisons and to quantify the similarity between different data samples. Correlithm objects 104 are data structures designed to improve the way a device stores, retrieves, and compares data samples in memory. Unlike conventional data structures, correlithm objects 104 are data structures where objects can be expressed in a high-dimensional space such that distance 106 between points in the space represent the similarity between different objects or data samples. In other words, the distance 106 between a pair of correlithm objects 104 in the n-dimensional space 102 indicates how similar the correlithm objects 104 are from each other and the data samples they represent. Correlithm objects 104 that are close to each other are more similar to each other than correlithm objects 104 that are further apart from each other. For example, in a facial recognition application, correlithm objects 104 used to represent images of different types of glasses may be relatively close to each other compared to correlithm objects 104 used to represent images of other features such as facial hair. An exact match between two data samples occurs when their corresponding correlithm objects 104 are the same or have no distance between them. When two data samples are not exact matches but are similar, the distance between their correlithm objects 104 can be used to indicate their similarities. In other words, the distance 106 between correlithm objects 104 can be used to identify both data samples that exactly match each other as well as data samples that do not match but are similar. This feature is unique to a correlithm processing system and is unlike conventional computers that are unable to detect when data samples are different but similar in some aspects.

Correlithm objects 104 also provide a data structure that is independent of the data type and format of the data samples they represent. Correlithm objects 104 allow data samples to be directly compared regardless of their original data type and/or format. In some instances, comparing data samples as correlithm objects 104 is computationally more efficient and faster than comparing data samples in their original format. For example, comparing images using conventional data structures involves significant amounts of image processing which is time consuming and consumes processing resources. Thus, using correlithm objects 104 to represent data samples provides increased flexibility and improved performance compared to using other conventional data structures.

In one embodiment, correlithm objects 104 may be represented using categorical binary strings. The number of bits used to represent the correlithm object 104 corresponds with the number of dimensions of the n-dimensional space 102 where the correlithm object 102 is located. For example, each correlithm object 104 may be uniquely identified using a 64-bit string in a 64-dimensional space 102. As another example, each correlithm object 104 may be uniquely identified using a 10-bit string in a 10-dimensional space 102. In other examples, correlithm objects 104 can be identified using any other suitable number of bits in a string that corresponds with the number of dimensions in the n-dimensional space 102.

In this configuration, the distance 106 between two correlithm objects 104 can be determined based on the differences between the bits of the two correlithm objects 104. In other words, the distance 106 between two correlithm objects can be determined based on how many individual bits differ between the correlithm objects 104. The distance 106 between two correlithm objects 104 can be computed using Hamming distance or any other suitable technique.

As an example using a 10-dimensional space 102, a first correlithm object 104 is represented by a first 10-bit string (1001011011) and a second correlithm object 104 is represented by a second 10-bit string (1000011011). The Hamming distance corresponds with the number of bits that differ between the first correlithm object 104 and the second correlithm object 104. In other words, the Hamming distance between the first correlithm object 104 and the second correlithm object 104 can be computed as follows:

$$\begin{array}{r}1001011011\\1000011011\\\hline 0001000000\end{array}$$

In this example, the Hamming distance is equal to one because only one bit differs between the first correlithm object 104 and the second correlithm object. As another example, a third correlithm object 104 is represented by a third 10-bit string (0110100100). In this example, the Hamming distance between the first correlithm object 104 and the third correlithm object 104 can be computed as follows:

$$\begin{array}{r}1001011011\\0110100100\\\hline 1111111111\end{array}$$

The Hamming distance is equal to ten because all of the bits are different between the first correlithm object 104 and the third correlithm object 104. In the previous example, a Hamming distance equal to one indicates that the first correlithm object 104 and the second correlithm object 104 are close to each other in the n-dimensional space 102, which means they are similar to each other. In the second example, a Hamming distance equal to ten indicates that the first correlithm object 104 and the third correlithm object 104 are further from each other in the n-dimensional space 102 and are less similar to each other than the first correlithm object 104 and the second correlithm object 104. In other words, the similarity between a pair of correlithm objects can be readily determined based on the distance between the pair correlithm objects.

As another example, the distance between a pair of correlithm objects 104 can be determined by performing an XOR operation between the pair of correlithm objects 104 and counting the number of logical high values in the binary string. The number of logical high values indicates the number of bits that are different between the pair of correlithm objects 104 which also corresponds with the Hamming distance between the pair of correlithm objects 104.

In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

The user device 100 is configured to implement or emulate a correlithm object processing system that comprises one or more sensors 302, nodes 304, and/or actors 306 in order to convert data samples between real world values or representations and to correlithm objects 104 in a correlithm object domain. Sensors 302 are generally configured to convert real world data samples to the correlithm object domain. Nodes 304 are generally configured to process or perform various operations on correlithm objects in the correlithm object domain. Actors 306 are generally configured to convert correlithm objects 104 into real world values or representations. Additional information about sensors 302, nodes 304, and actors 306 is described in FIG. 3.

Performing operations using correlithm objects 104 in a correlithm object domain allows the user device 100 to identify relationships between data samples that cannot be identified using conventional data processing systems. For example, in the correlithm object domain, the user device 100 is able to identify not only data samples that exactly match an input data sample, but also other data samples that have similar characteristics or features as the input data samples. Conventional computers are unable to identify these types of relationships readily. Using correlithm objects 104 improves the operation of the user device 100 by enabling the user device 100 to efficiently process data samples and identify relationships between data samples without relying on signal processing techniques that require a significant amount of processing resources. These benefits allow the user device 100 to operate more efficiently than conventional computers by reducing the amount of processing power and resources that are needed to perform various operations.

Figure 2:
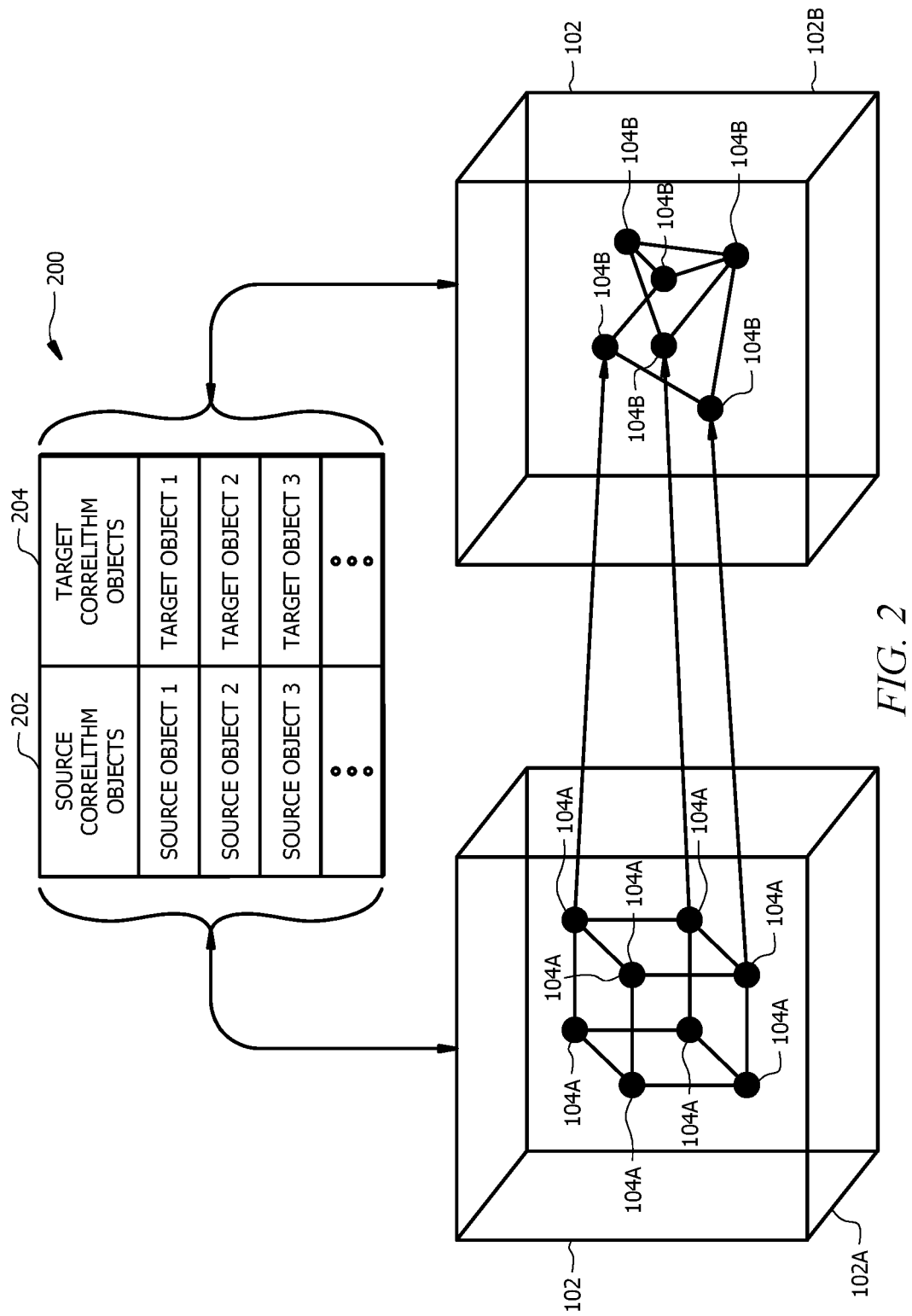
FIG. 2 is a perspective view of an embodiment of a mapping between correlithm objects in different n-dimensional spaces.

FIG. 2 is a schematic view of an embodiment of a mapping between correlithm objects 104 in different n-dimensional spaces 102. When implementing a correlithm object processing system, the user device 100 performs operations within the correlithm object domain using correlithm objects 104 in different n-dimensional spaces 102. As an example, the user device 100 may convert different types of data samples having real world values into correlithm objects 104 in different n-dimensional spaces 102. For instance, the user device 100 may convert data samples of text into a first set of correlithm objects 104 in a first n-dimensional space 102 and data samples of audio samples as a second set of correlithm objects 104 in a second n-dimensional space 102. Conventional systems require data samples to be of the same type and/or format in order to perform any kind of operation on the data samples. In some instances, some types of data samples cannot be compared because there is no common format available. For example, conventional computers are unable to compare data samples of images and data samples of audio samples because there is no common format. In contrast, the user device 100 implementing a correlithm object processing system is able to compare and perform operations using correlithm objects 104 in the correlithm object domain regardless of the type or format of the original data samples.

In FIG. 2, a first set of correlithm objects 104A are defined within a first n-dimensional space 102A and a second set of correlithm objects 104B are defined within a second n-dimensional space 102B. The n-dimensional spaces may have the same number of dimensions or a different number of dimensions. For example, the first n-dimensional space 102A and the second n-dimensional space 102B may both be three dimensional spaces. As another example, the first n-dimensional space 102A may be a three dimensional space and the second n-dimensional space 102B may be a nine dimensional space. Correlithm objects 104 in the first n-dimensional space 102A and second n-dimensional space 102B are mapped to each other. In other words, a correlithm object 104A in the first n-dimensional space 102A may reference or be linked with a particular correlithm object 104B in the second n-dimensional space 102B. The correlithm objects 104 may also be linked with and referenced with other correlithm objects 104 in other n-dimensional spaces 102.

In one embodiment, a data structure such as table 200 may be used to map or link correlithm objects 104 in different n-dimensional spaces 102. In some instances, table 200 is referred to as a node table. Table 200 is generally configured to identify a first plurality of correlithm objects 104 in a first n-dimensional space 102 and a second plurality of correlithm objects 104 in a second n-dimensional space 102. Each correlithm object 104 in the first n-dimensional space 102 is linked with a correlithm object 104 is the second n-dimensional space 102. For example, table 200 may be configured with a first column 202 that lists correlithm objects 104A as source correlithm objects and a second column 204 that lists corresponding correlithm objects 104B as target correlithm objects. In other examples, table 200 may be configured in any other suitable manner or may be implemented using any other suitable data structure. In some embodiments, one or more mapping functions may be used to convert between a correlithm object 104 in a first n-dimensional space and a correlithm object 104 is a second n-dimensional space.

Figure 3:
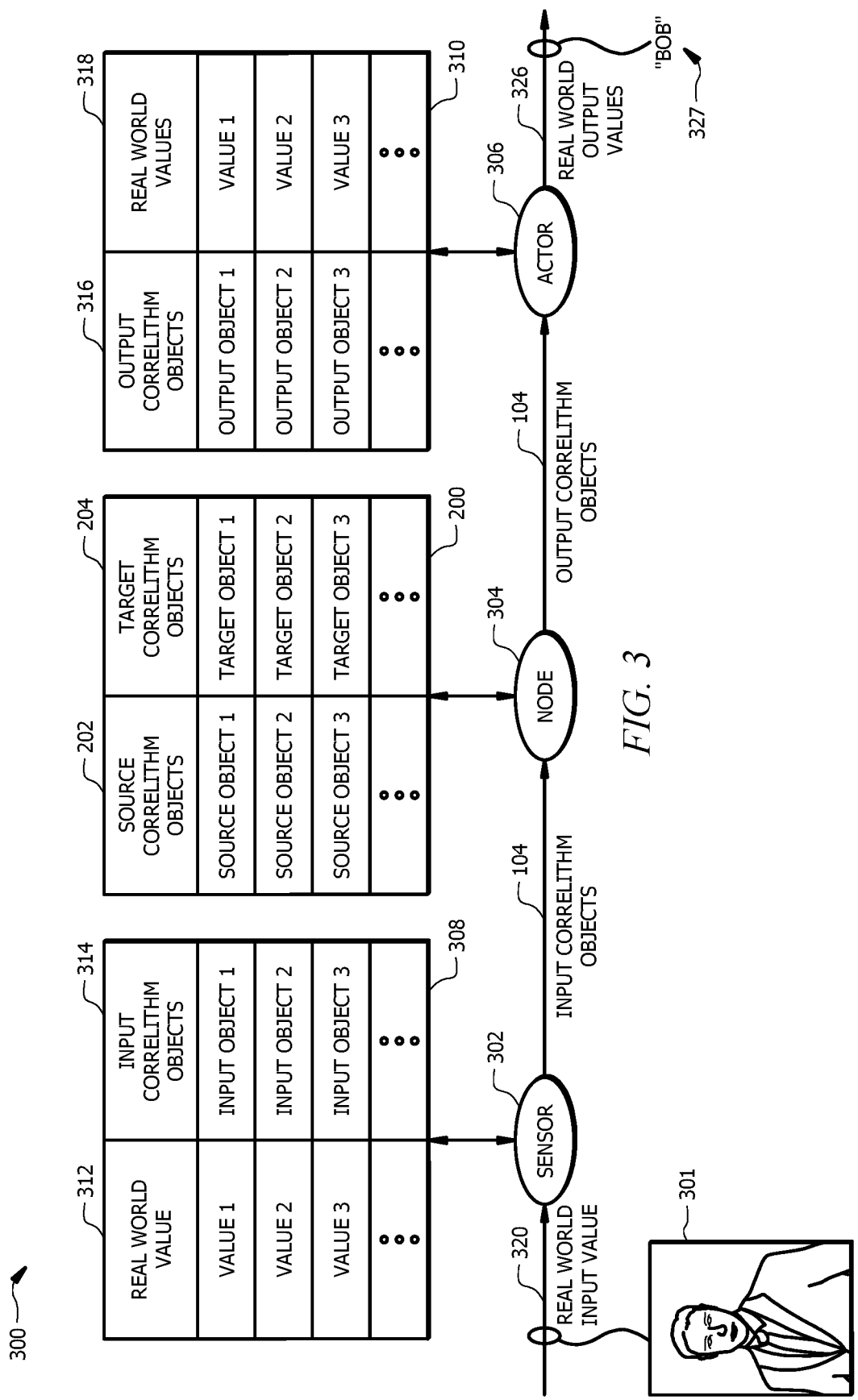
FIG. 3 is a schematic view of an embodiment of a correlithm object processing system.

FIG. 3 is a schematic view of an embodiment of a correlithm object processing system 300 that is implemented by a user device 100 to perform operations using correlithm objects 104. The system 300 generally comprises a sensor 302, a node 304, and an actor 306. The system 300 may be configured with any suitable number and/or configuration of sensors 302, nodes 304, and actors 306. An example of the system 300 in operation is described in FIG. 4. In one embodiment, a sensor 302, a node 304, and an actor 306 may all be implemented on the same device (e.g. user device 100). In other embodiments, a sensor 302, a node 304, and an actor 306 may each be implemented on different devices in signal communication with each other for example over a network. In other embodiments, different devices may be configured to implement any combination of sensors 302, nodes 304, and actors 306.

Sensors 302 serve as interfaces that allow a user device 100 to convert real world data samples into correlithm objects 104 that can be used in the correlithm object domain. Sensors 302 enable the user device 100 to compare and perform operations using correlithm objects 104 regardless of the data type or format of the original data sample. Sensors 302 are configured to receive a real world value 320 representing a data sample as an input, to determine a correlithm object 104 based on the real world value 320, and to output the correlithm object 104. For example, the sensor 302 may receive an image 301 of a person and output a correlithm object 322 to the node 304 or actor 306. In one embodiment, sensors 302 are configured to use sensor tables 308 that link a plurality of real world values with a plurality of correlithm objects 104 in an n-dimensional space 102. Real world values are any type of signal, value, or representation of data samples. Examples of real world values include, but are not limited to, images, pixel values, text, audio signals, electrical signals, and biometric signals. As an example, a sensor table 308 may be configured with a first column 312 that lists real world value entries corresponding with different images and a second column 314 that lists corresponding correlithm objects 104 as input correlithm objects. In other examples, sensor tables 308 may be configured in any other suitable manner or may be implemented using any other suitable data structure. In some embodiments, one or more mapping functions may be used to translate between a real world value 320 and a correlithm object 104 in an n-dimensional space. Additional information for implementing or emulating a sensor 302 in hardware is described in FIG. 5.

Nodes 304 are configured to receive a correlithm object 104 (e.g. an input correlithm object 104), to determine another correlithm object 104 based on the received correlithm object 104, and to output the identified correlithm object 104 (e.g. an output correlithm object 104). In one embodiment, nodes 304 are configured to use node tables 200 that link a plurality of correlithm objects 104 from a first n-dimensional space 102 with a plurality of correlithm objects 104 in a second n-dimensional space 102. A node table 200 may be configured similar to the table 200 described in FIG. 2. Additional information for implementing or emulating a node 304 in hardware is described in FIG. 5.

Actors 306 serve as interfaces that allow a user device 100 to convert correlithm objects 104 in the correlithm object domain back to real world values or data samples. Actors 306 enable the user device 100 to convert from correlithm objects 104 into any suitable type of real world value. Actors 306 are configured to receive a correlithm object 104 (e.g. an output correlithm object 104), to determine a real world output value 326 based on the received correlithm object 104, and to output the real world output value 326. The real world output value 326 may be a different data type or representation of the original data sample. As an example, the real world input value 320 may be an image 301 of a person and the resulting real world output value 326 may be text 327 and/or an audio signal identifying the person. In one embodiment, actors 306 are configured to use actor tables 310 that link a plurality of correlithm objects 104 in an n-dimensional space 102 with a plurality of real world values. As an example, an actor table 310 may be configured with a first column 316 that lists correlithm objects 104 as output correlithm objects and a second column 318 that lists real world values. In other examples, actor tables 310 may be configured in any other suitable manner or may be implemented using any other suitable data structure. In some embodiments, one or more mapping functions may be employed to translate between a correlithm object 104 in an n-dimensional space and a real world output value 326. Additional information for implementing or emulating an actor 306 in hardware is described in FIG. 5.

A correlithm object processing system 300 uses a combination of a sensor table 308, a node table 200, and/or an actor table 310 to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures. Conventional systems require data samples to be of the same type and/or format in order to perform any kind of operation on the data samples. In some instances, some types of data samples are incompatible with each other and cannot be compared because there is no common format available. For example, conventional computers are unable to compare data samples of images with data samples of audio samples because there is no common format available. In contrast, a device implementing a correlithm object processing system uses a combination of a sensor table 308, a node table 200, and/or an actor table 310 to compare and perform operations using correlithm objects 104 in the correlithm object domain regardless of the type or format of the original data samples. The correlithm object processing system 300 uses a combination of a sensor table 308, a node table 200, and/or an actor table 310 as a specific set of rules that provides a particular solution to dealing with different types of data samples and allows devices to perform operations on different types of data samples using correlithm objects 104 in the correlithm object domain. In some instances, comparing data samples as correlithm objects 104 is computationally more efficient and faster than comparing data samples in their original format. Thus, using correlithm objects 104 to represent data samples provides increased flexibility and improved performance compared to using other conventional data structures. The specific set of rules used by the correlithm object processing system 300 go beyond simply using routine and conventional activities in order to achieve this new functionality and performance improvements.

In addition, correlithm object processing system 300 uses a combination of a sensor table 308, a node table 200, and/or an actor table 310 to provide a particular manner for transforming data samples between ordinal number representations and correlithm objects 104 in a correlithm object domain. For example, the correlithm object processing system 300 may be configured to transform a representation of a data sample into a correlithm object 104, to perform various operations using the correlithm object 104 in the correlithm object domain, and to transform a resulting correlithm object 104 into another representation of a data sample. Transforming data samples between ordinal number representations and correlithm objects 104 involves fundamentally changing the data type of data samples between an ordinal number system and a categorical number system to achieve the previously described benefits of the correlithm object processing system 300.

Figure 4:
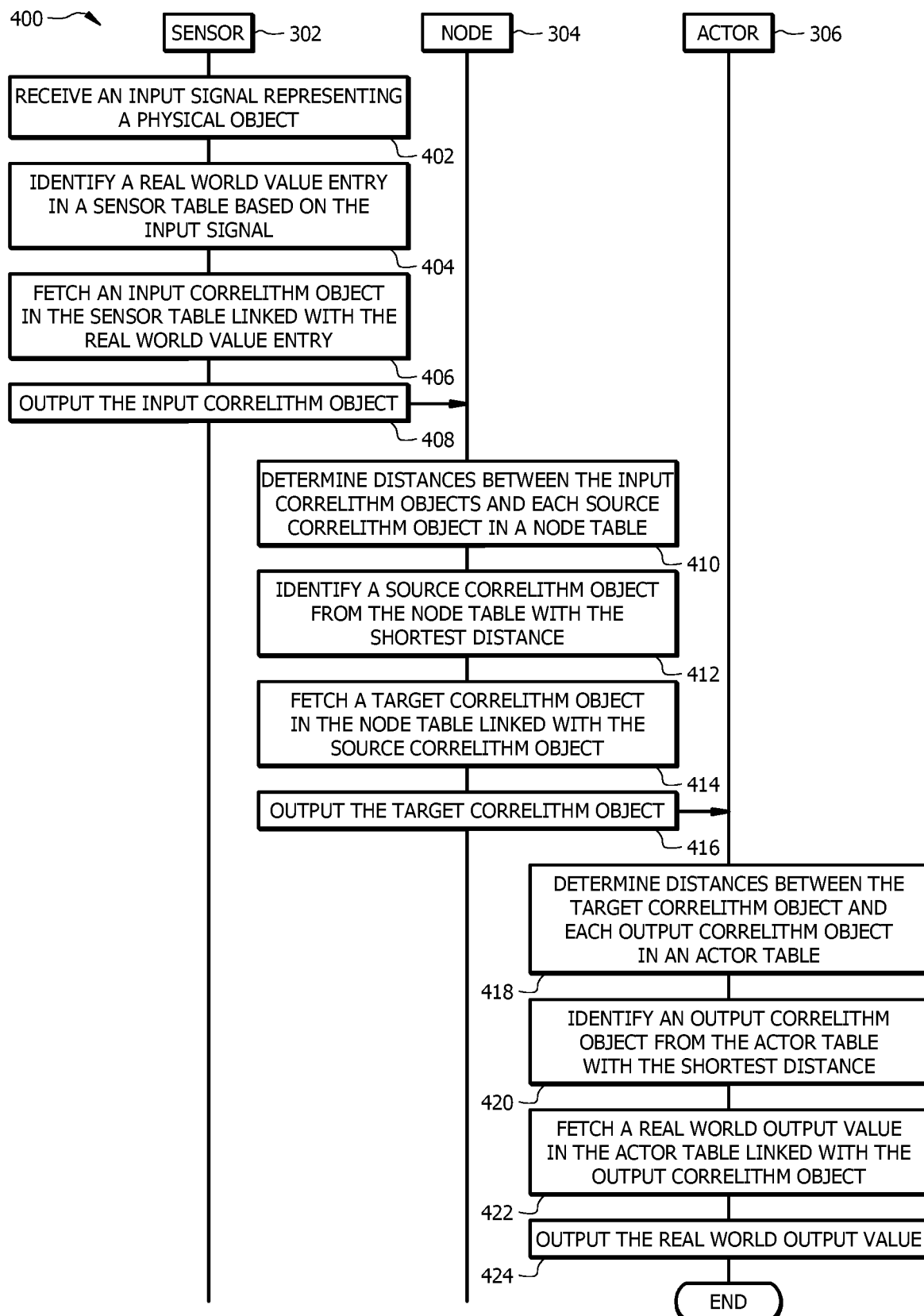
FIG. 4 is a protocol diagram of an embodiment of a correlithm object process flow.

FIG. 4 is a protocol diagram of an embodiment of a correlithm object process flow 400. A user device 100 implements process flow 400 to emulate a correlithm object processing system 300 to perform operations using correlithm object 104 such as facial recognition. The user device 100 implements process flow 400 to compare different data samples (e.g. images, voice signals, or text) to each other and to identify other objects based on the comparison. Process flow 400 provides instructions that allows user devices 100 to achieve the improved technical benefits of a correlithm object processing system 300.

Conventional systems are configured to use ordinal numbers for identifying different data samples. Ordinal based number systems only provide information about the sequence order of numbers based on their numeric values, and do not provide any information about any other types of relationships for the data samples being represented by the numeric values such as similarity. In contrast, a user device 100 can implement or emulate the correlithm object processing system 300 which provides an unconventional solution that uses categorical numbers and correlithm objects 104 to represent data samples. For example, the system 300 may be configured to use binary integers as categorical numbers to generate correlithm objects 104 which enables the user device 100 to perform operations directly based on similarities between different data samples. Categorical numbers provide information about how similar different data sample are from each other. Correlithm objects 104 generated using categorical numbers can be used directly by the system 300 for determining how similar different data samples are from each other without relying on exact matches, having a common data type or format, or conventional signal processing techniques.

A non-limiting example is provided to illustrate how the user device 100 implements process flow 400 to emulate a correlithm object processing system 300 to perform facial recognition on an image to determine the identity of the person in the image. In other examples, the user device 100 may implement process flow 400 to emulate a correlithm object processing system 300 to perform voice recognition, text recognition, or any other operation that compares different objects.

At step 402, a sensor 302 receives an input signal representing a data sample. For example, the sensor 302 receives an image of person's face as a real world input value 320. The input signal may be in any suitable data type or format.

In one embodiment, the sensor 302 may obtain the input signal in real-time from a peripheral device (e.g. a camera). In another embodiment, the sensor 302 may obtain the input signal from a memory or database.

At step 404, the sensor 302 identifies a real world value entry in a sensor table 308 based on the input signal. In one embodiment, the system 300 identifies a real world value entry in the sensor table 308 that matches the input signal. For example, the real world value entries may comprise previously stored images. The sensor 302 may compare the received image to the previously stored images to identify a real world value entry that matches the received image. In one embodiment, when the sensor 302 does not find an exact match, the sensor 302 finds a real world value entry that closest matches the received image.

At step 406, the sensor 302 identifies and fetches an input correlithm object 104 in the sensor table 308 linked with the real world value entry. At step 408, the sensor 302 sends the identified input correlithm object 104 to the node 304. In one embodiment, the identified input correlithm object 104 is represented in the sensor table 308 using a categorical binary integer string. The sensor 302 sends the binary string representing to the identified input correlithm object 104 to the node 304.

At step 410, the node 304 receives the input correlithm object 104 and determines distances 106 between the input correlithm object 104 and each source correlithm object 104 in a node table 200. In one embodiment, the distance 106 between two correlithm objects 104 can be determined based on the differences between the bits of the two correlithm objects 104. In other words, the distance 106 between two correlithm objects can be determined based on how many individual bits differ between a pair of correlithm objects 104. The distance 106 between two correlithm objects 104 can be computed using Hamming distance or any other suitable technique. In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

At step 412, the node 304 identifies a source correlithm object 104 from the node table 200 with the shortest distance 106. A source correlithm object 104 with the shortest distance from the input correlithm object 104 is a correlithm object 104 either matches or most closely matches the received input correlithm object 104.

At step 414, the node 304 identifies and fetches a target correlithm object 104 in the node table 200 linked with the source correlithm object 104. At step 416, the node 304 outputs the identified target correlithm object 104 to the actor 306. In this example, the identified target correlithm object 104 is represented in the node table 200 using a categorical binary integer string. The node 304 sends the binary string representing to the identified target correlithm object 104 to the actor 306.

At step 418, the actor 306 receives the target correlithm object 104 and determines distances between the target correlithm object 104 and each output correlithm object 104 in an actor table 310. The actor 306 may compute the distances between the target correlithm object 104 and each output correlithm object 104 in an actor table 310 using a process similar to the process described in step 410.

At step 420, the actor 306 identifies an output correlithm object 104 from the actor table 310 with the shortest distance 106. An output correlithm object 104 with the shortest distance from the target correlithm object 104 is a correlithm object 104 either matches or most closely matches the received target correlithm object 104.

At step 422, the actor 306 identifies and fetches a real world output value in the actor table 310 linked with the output correlithm object 104. The real world output value may be any suitable type of data sample that corresponds with the original input signal. For example, the real world output value may be text that indicates the name of the person in the image or some other identifier associated with the person in the image. As another example, the real world output value may be an audio signal or sample of the name of the person in the image. In other examples, the real world output value may be any other suitable real world signal or value that corresponds with the original input signal. The real world output value may be in any suitable data type or format.

At step 424, the actor 306 outputs the identified real world output value. In one embodiment, the actor 306 may output the real world output value in real-time to a peripheral device (e.g. a display or a speaker). In one embodiment, the actor 306 may output the real world output value to a memory or database. In one embodiment, the real world output value is sent to another sensor 302. For example, the real world output value may be sent to another sensor 302 as an input for another process.

Figure 5:
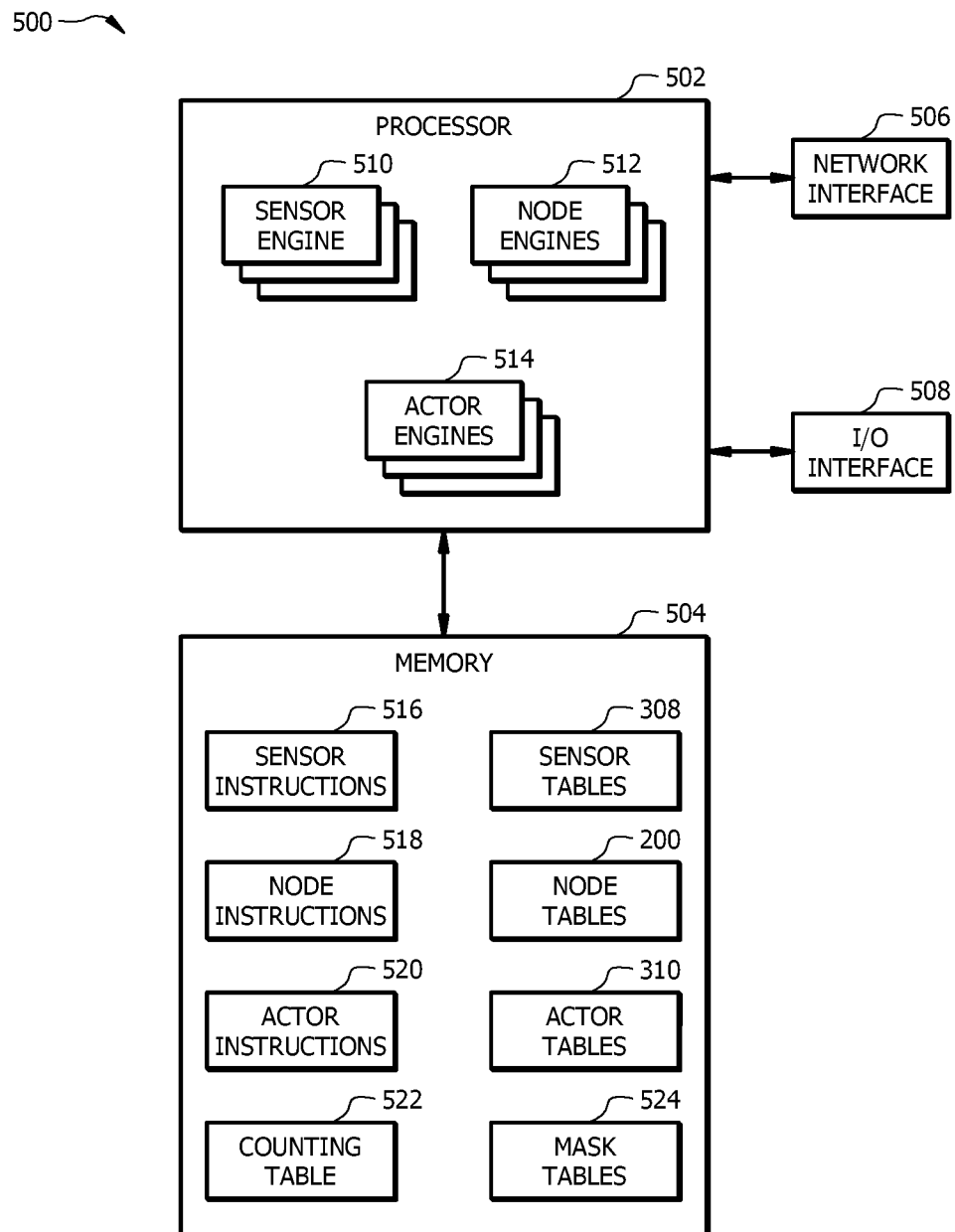
FIG. 5 is a schematic diagram of an embodiment a computer architecture for emulating a correlithm object processing system.

FIG. 5 is a schematic diagram of an embodiment of a computer architecture 500 for emulating a correlithm object processing system 300 in a user device 100. The computer architecture 500 comprises a processor 502, a memory 504, a network interface 506, and an input-output (I/O) interface 508. The computer architecture 500 may be configured as shown or in any other suitable configuration.

The processor 502 comprises one or more processors operably coupled to the memory 504. The processor 502 is any electronic circuitry including, but not limited to, state machines, one or more central processing unit (CPU) chips, logic units, cores (e.g. a multi-core processor), field-programmable gate array (FPGAs), application specific integrated circuits (ASICs), graphics processing units (GPUs), or digital signal processors (DSPs). The processor 502 may be a programmable logic device, a microcontroller, a microprocessor, or any suitable combination of the preceding. The processor 502 is communicatively coupled to and in signal communication with the memory 204. The one or more processors are configured to process data and may be implemented in hardware or software. For example, the processor 502 may be 8-bit, 16-bit, 32-bit, 64-bit or of any other suitable architecture. The processor 502 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors are configured to implement various instructions. For example, the one or more processors are configured to execute instructions to implement sensor engines 510, node engines 512, and actor engines 514. In an embodiment, the sensor engines 510, the node engines 512, and the actor engines 514 are implemented using logic units, FPGAs, ASICs, DSPs, or any other suitable hardware. The sensor engines 510, the node engines 512, and the actor engines 514 are each configured to implement a specific set of rules or process that provides an improved technological result.

In one embodiment, the sensor engine 510 is configured to receive a real world value 320 as an input, to determine a correlithm object 104 based on the real world value 320, and to output the correlithm object 104. Examples of the sensor engine 510 in operation are described in FIG. 4.

In one embodiment, the node engine 512 is configured to receive a correlithm object 104 (e.g. an input correlithm object 104), to determine another correlithm object 104 based on the received correlithm object 104, and to output the identified correlithm object 104 (e.g. an output correlithm object 104). The node engine 512 is also configured to compute distances between pairs of correlithm objects 104. Examples of the node engine 512 in operation are described in FIGS. 4 and 6-13.

In one embodiment, the actor engine 514 is configured to receive a correlithm object 104 (e.g. an output correlithm object 104), to determine a real world output value 326 based on the received correlithm object 104, and to output the real world output value 326. Examples of the actor engine 514 in operation are described in FIGS. 4 and 6-13.

The memory 504 comprises one or more non-transitory disks, tape drives, or solid-state drives, and may be used as an over-flow data storage device, to store programs when such programs are selected for execution, and to store instructions and data that are read during program execution. The memory 504 may be volatile or non-volatile and may comprise read-only memory (ROM), random-access memory (RAM), ternary content-addressable memory (TCAM), dynamic random-access memory (DRAM), and static random-access memory (SRAM). The memory 504 is operable to store sensor instructions 516, node instructions 518, actor instructions 520, sensor tables 308, node tables 200, actor tables 310, and/or any other data or instructions. The sensor instructions 516, the node instructions 518, and the actor instructions 520 comprise any suitable set of instructions, logic, rules, or code operable to execute the sensor engine 510, node engine 512, and the actor engine 514, respectively.

The sensor tables 308, the node tables 200, and the actor tables 310 may be configured similar to the sensor tables 308, the node tables 200, and the actor tables 310 described in FIG. 3, respectively.

The network interface 506 is configured to enable wired and/or wireless communications. The network interface 506 is configured to communicate data with any other device or system. For example, the network interface 506 may be configured for communication with a modem, a switch, a router, a bridge, a server, or a client. The processor 502 is configured to send and receive data using the network interface 506.

The I/O interface 508 may comprise ports, transmitters, receivers, transceivers, or any other devices for transmitting and/or receiving data with peripheral devices as would be appreciated by one of ordinary skill in the art upon viewing this disclosure. For example, the I/O interface 508 may be configured to communicate data between the processor 502 and peripheral hardware such as a graphical user interface, a display, a mouse, a keyboard, a key pad, and a touch sensor (e.g. a touch screen).

Figure 6A:
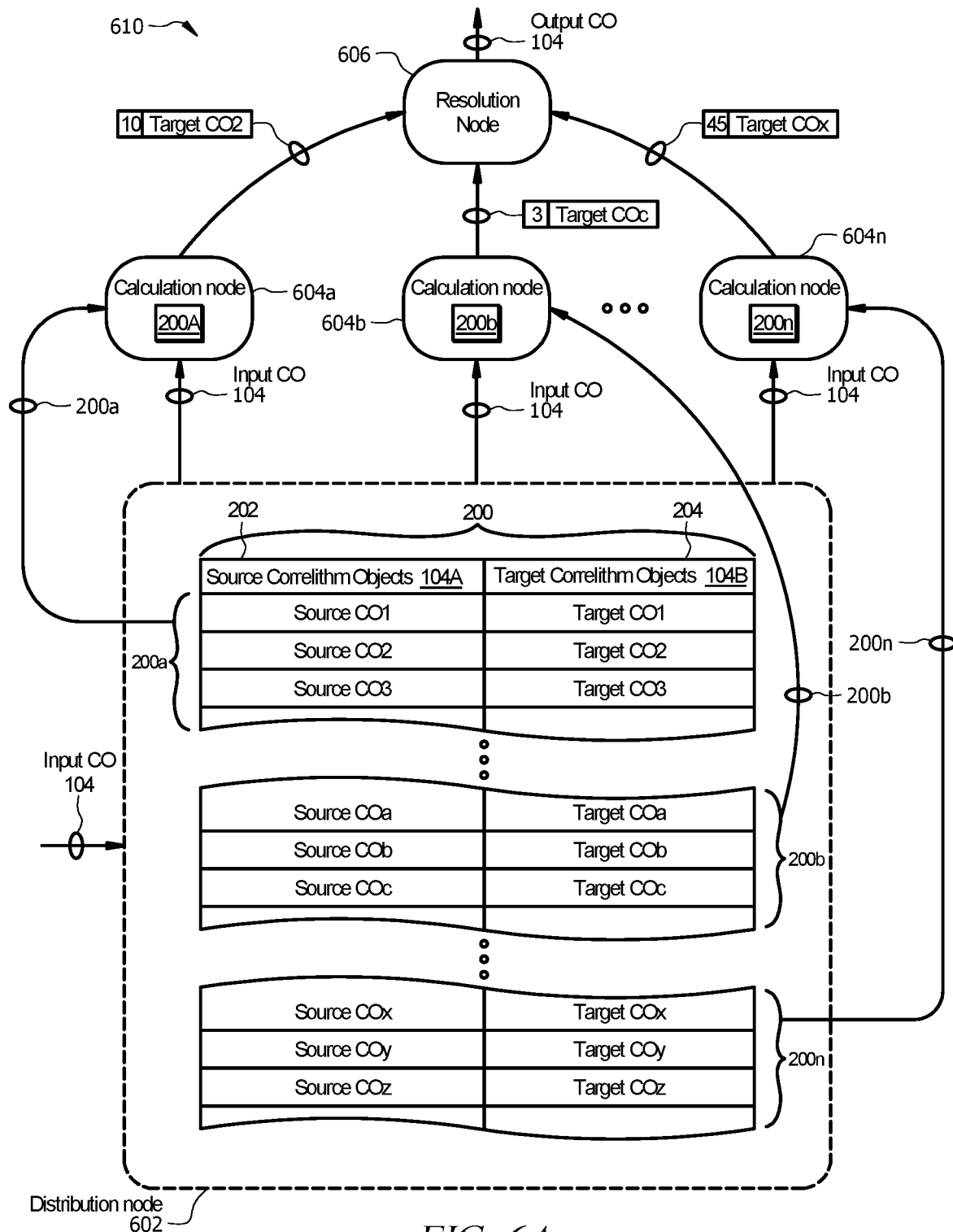
FIGS. 6A-B illustrate a schematic diagram of one embodiment of a correlithm object processing system.
Figure 6B:
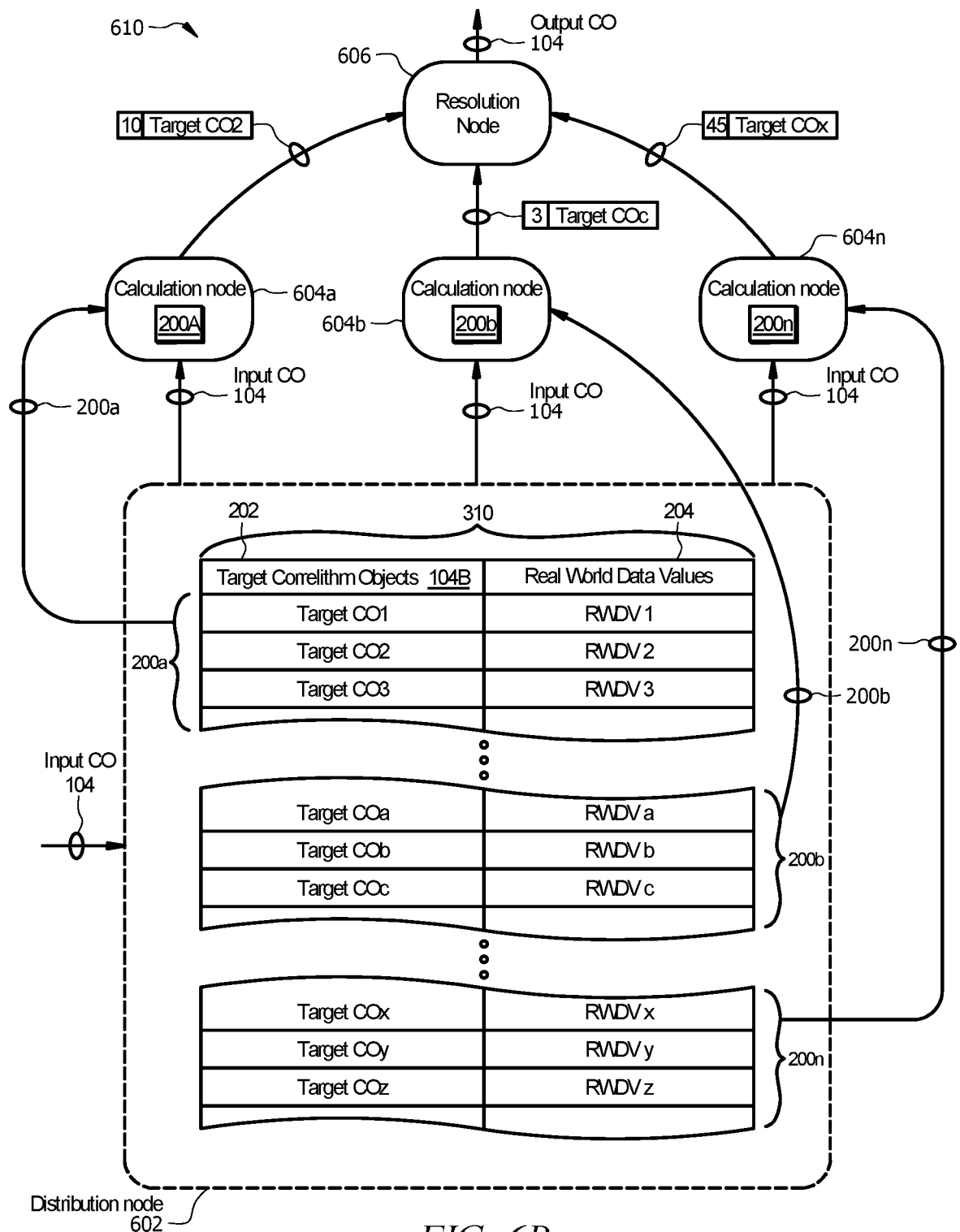
Figure 8A:
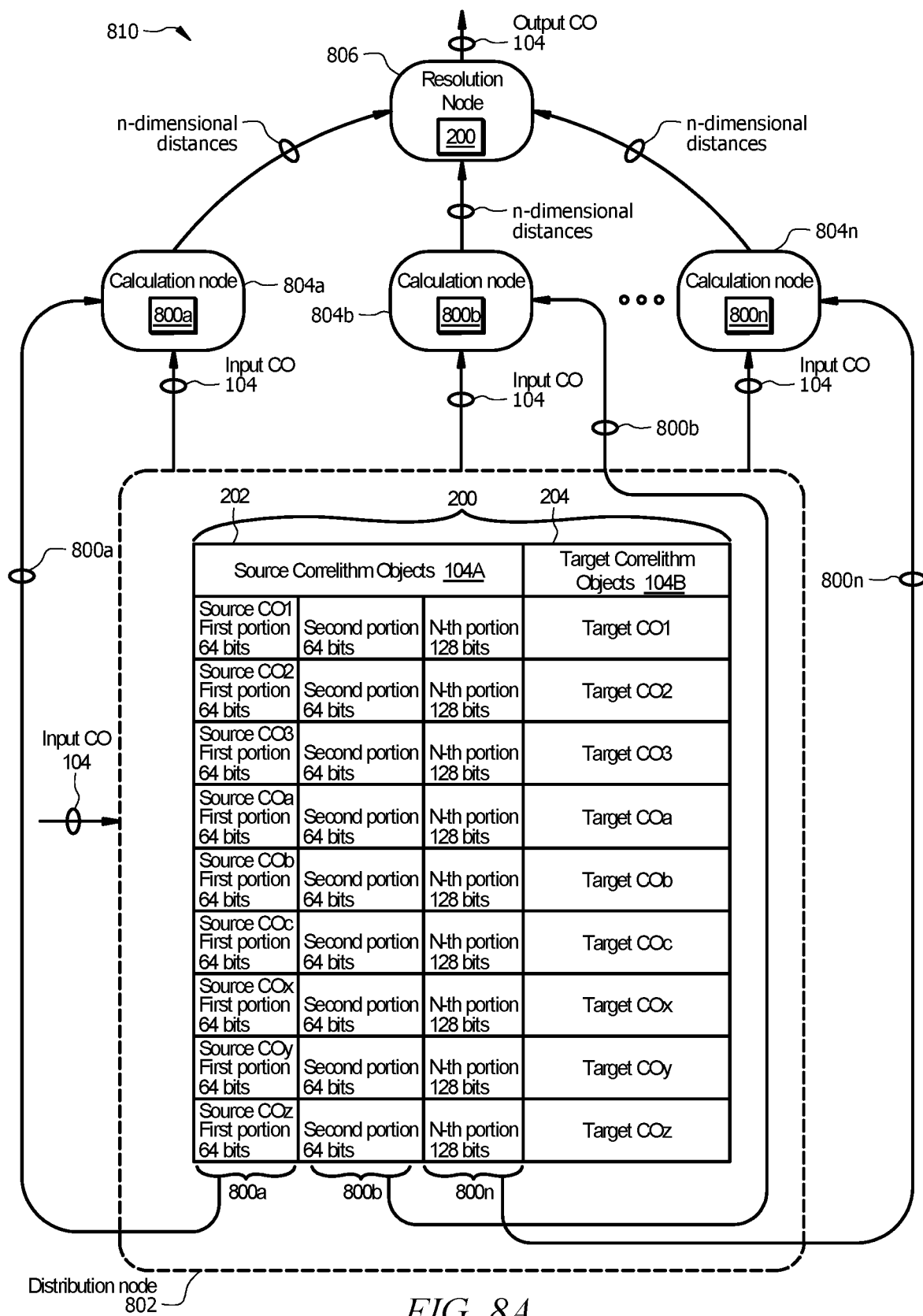
FIGS. 8A-B illustrate a schematic diagram of another embodiment of a correlithm object processing system.
Figure 8B:
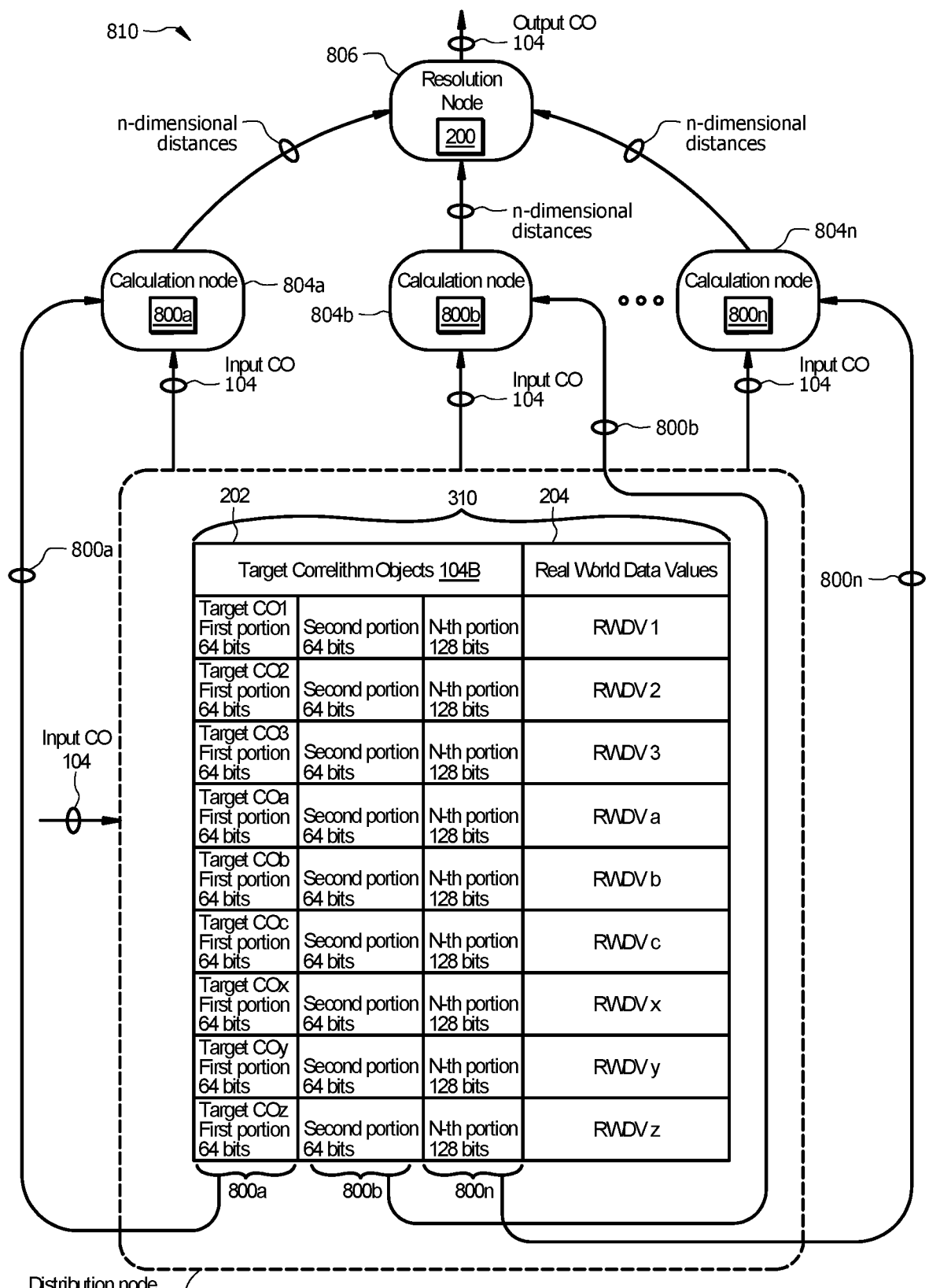
Figure 9A:
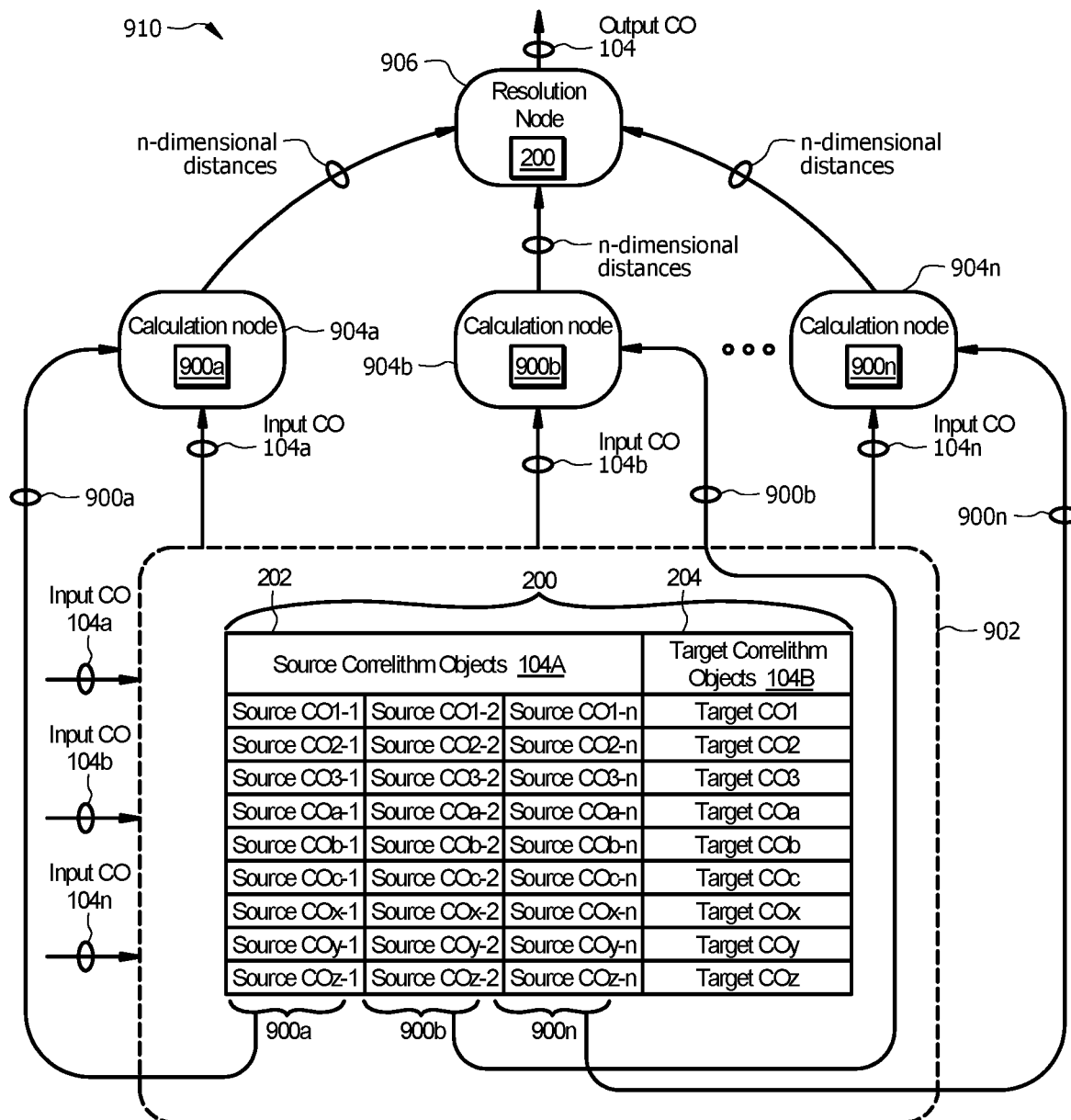
FIGS. 9A-B illustrate a schematic diagram of another embodiment of a correlithm object processing system.
Figure 9B:
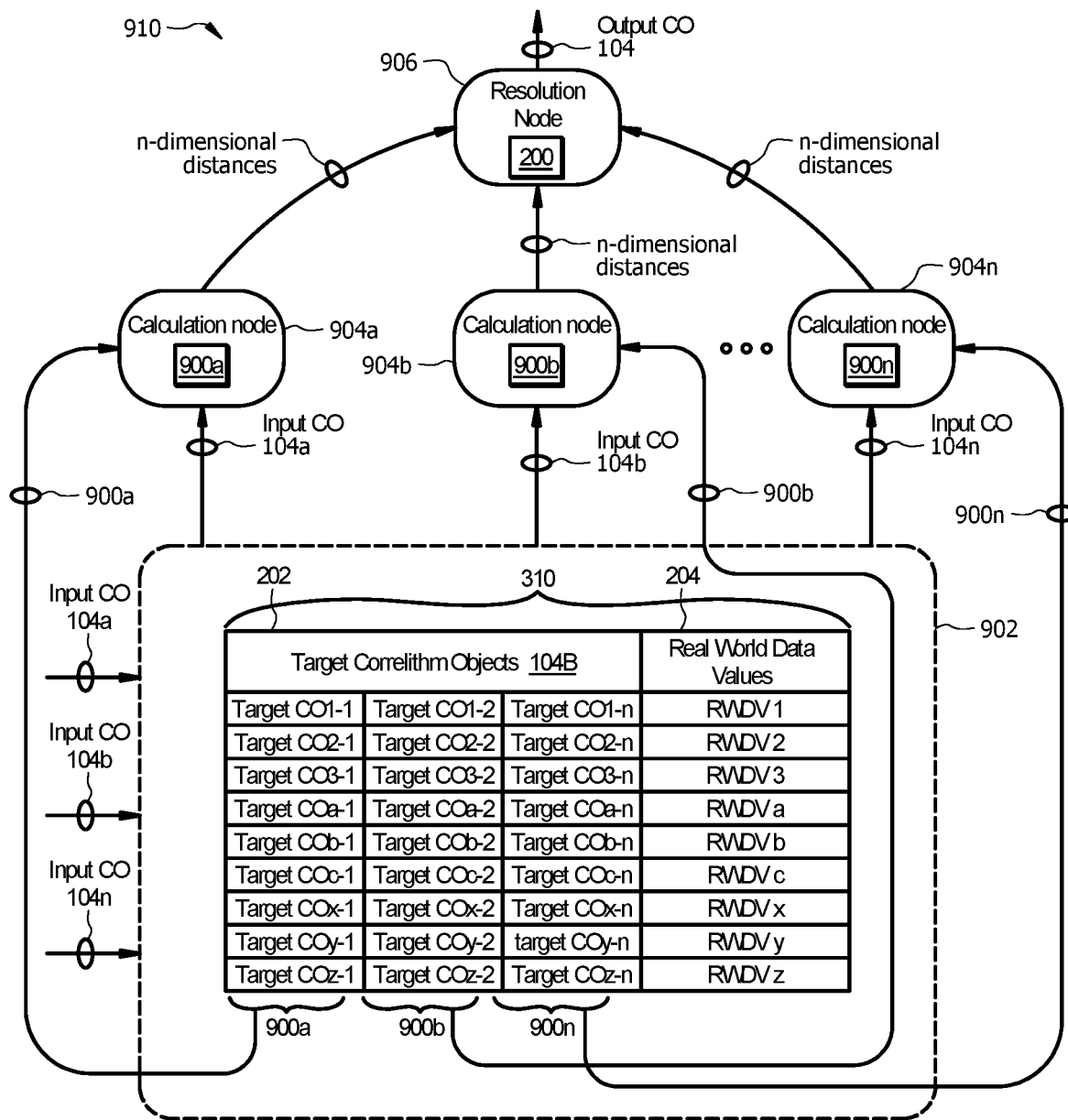
Figure 12A:
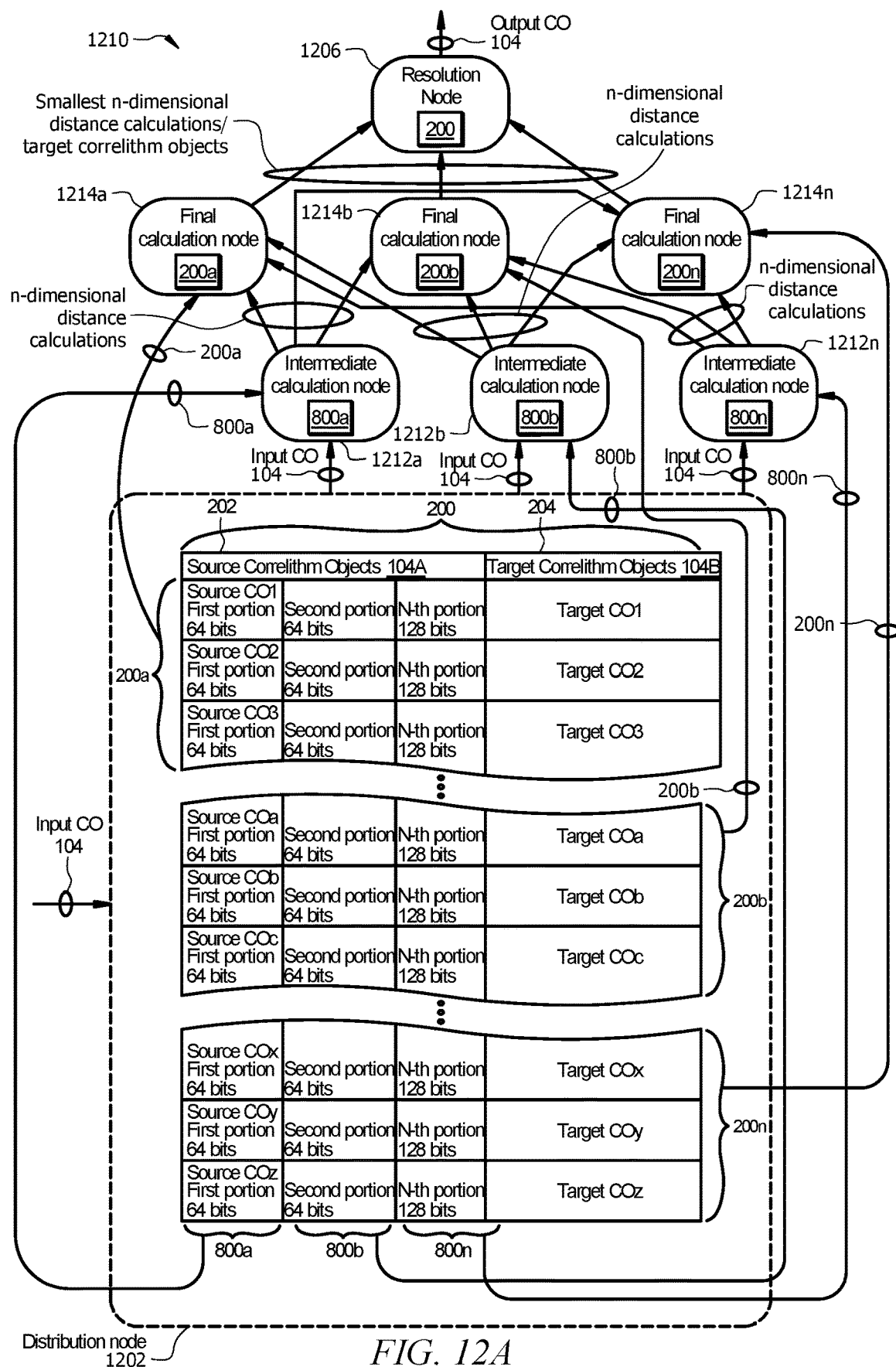
FIGS. 12A-B illustrate a schematic diagram of one embodiment of a correlithm object processing system.
Figure 12B:
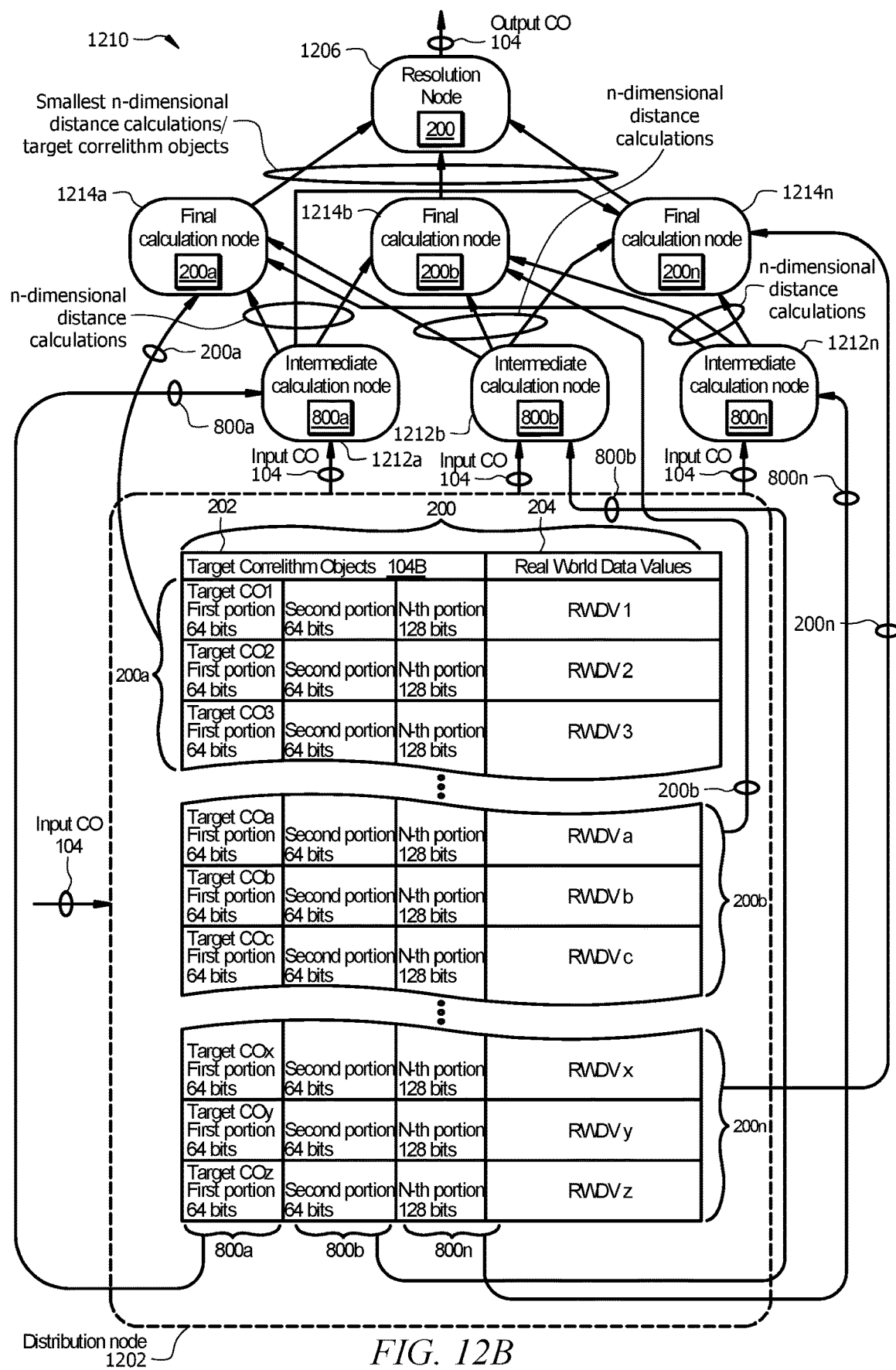

FIGS. 6A-B illustrate one embodiment of a correlithm object processing system 610 that includes a distribution node 602, calculation nodes 604a and 604b through 604n, and a resolution node 606, all communicatively coupled to each other. FIGS. 8A-B illustrate one embodiment of a correlithm object processing system 810 that includes a distribution node 802, calculation nodes 804a and 804b through 804n, and a resolution node 806, all communicatively coupled to each other. FIGS. 9A-B illustrate one embodiment of a correlithm object processing system 910 that includes a distribution node 902, calculation nodes 904a and 904b through 904n, and a resolution node 906, all communicatively coupled to each other. FIGS. 12A-B illustrate one embodiment of a correlithm object processing system 1210 that includes a distribution node 1202, calculation nodes 1204a and 1204b through 1204n, and a resolution node 1206, all communicatively coupled to each other. Systems 610, 810, 910, and 1210 can each be implemented in a computer architecture 500 (as illustrated in FIG. 5) associated with one or more user devices 100 (as illustrated in FIG. 1) to implement a variety of computing environments. Accordingly, nodes 602, 604a-n, and 606, nodes 802, 804a-n, and 806, nodes 902, 904a-n, and 906, and/or nodes 1202, 1212a-n, 1214a-n, and 1206 may be implemented using any suitable number and combination of node engines 512, processors 502, and memories 504. In some examples, nodes 602, 604a-n, and 606, nodes 802, 804a-n, and 806, nodes 902, 904a-n, and 906, and/or nodes 1202, 1212a-n, 1214a-n, and 1206 may reside in a primarily centralized or stand-alone environment. Alternatively, or in addition, systems 610, 810, 910, and/or 1210 can be implemented such that nodes 602, 604a-n, and 606, nodes 802, 804a-n, and 806, nodes 902, 904a-n, and 906, and/or nodes 1202, 1212a-n, 1214a-n, and 1206 reside in a primarily distributed or cloud computing environment. Computer architecture 500 used to implement systems 610, 810, 910, and/or 1210 can leverage any number and combination of computing paradigms, such as parallel computing, concurrent computing, distributed computing, and the like.

In parallel computing, a computational task is typically broken down into several, often many, similar subtasks that can be processed independently and whose results are combined afterwards, upon completion. In concurrent computing, the various processes may not address related tasks; when they do, as is typical in distributed computing, the separate tasks may have a varied nature and often involve some inter-process communication during execution. In distributed computing, a distributed computer (also known as a distributed memory multiprocessor) is a distributed memory computer system in which the processing elements are connected by a network. Each of these computing paradigms are highly scalable.

The computing environments in which systems 610, 810, 910, and/or 1210 are implemented to support parallel processing, whereby their respective nodes 602, 604a-n, and 606, nodes 802, 804a-n, and 806, nodes 902, 904a-n, and 906, and/or nodes 1202, 1212a-n, 1214a-n, and 1206 can execute simultaneously on different processors or servers associated with the same or different computers. In this way, systems 610, 810, 910, 1210 can leverage multi-core, multi-threaded and multi-processor computers having multiple processing elements within a single machine; cluster computing (composed of multiple standalone machines connected by a network); massively parallel processors (a single computer with many networked processors); symmetric multiprocessors (a computer system with multiple identical processors that share memory and connect via a bus); and grid computing (computers communicating over the Internet to work on a given problem), among others understood by persons of ordinary skill in the art of computing.

Referring now to FIG. 6A, distribution node 602 stores a correlithm object mapping table 200 configured with a first column 202 that includes source correlithm objects 104A and a second column 204 that includes corresponding target correlithm objects 104B. Although table 200 is described with respect to columns 202 and 204, one of ordinary skill in the art will appreciate that any suitable organization of data or data structure that can map source correlithm objects 104A to target correlithm objects 104B can be used in system 610. The source correlithm objects 104A and target correlithm objects 104B each reside in the same or different n-dimensional spaces 102. In one embodiment, source correlithm objects 104A and target correlithm objects 104B are each n-bit digital words comprising binary values. For example, they may comprise 64-bit, 128-bit, or 256-bit digital words comprising a binary string of values.

As described above with respect to FIG. 3, a node 304 is generally configured to receive an input correlithm object 104, identify the source correlithm object 104A that most closely matches the input correlithm object 104, and output the target correlithm object 104B corresponding to the identified source correlithm object 104A. Finding the source correlithm object 104A that most closely matches the input correlithm object 104 may involve computing the n-dimensional distance (e.g., Hamming distance, Minkowski distance, or other suitable distance) between the input correlithm object 104 and each of the source correlithm objects 104A, and identifying the source correlithm object 104A that results in the smallest n-dimensional distance calculation. Performing this distance calculation serially for a relatively large number of source correlithm objects 104A in a relatively large correlithm object mapping table 200 can be time and resource consuming, which can create bottlenecks in a correlithm object processing system. The present disclosure provides a technical solution whereby the n-dimensional distance calculation is performed using parallel processing techniques implemented by calculation nodes 604a-n, and resolution node 606, as described in greater detail below.

Distribution node 602 divides correlithm object mapping table 200 into any suitable number of portions, such as first portion 200a of the correlithm object mapping table 200, a second portion 200b of the correlithm object mapping table 200, and an n-th portion 200n of the correlithm object mapping table 200. The first portion 200a includes a first subset of the source correlithm objects 104A and their corresponding target correlithm objects 104B from the entire correlithm object mapping table 200. For example, as illustrated in FIG. 6A, the first portion 200a of the correlithm object mapping table 200 includes source correlithm objects 1-3 and the corresponding target correlithm objects 1-3. The second portion 200b includes a second subset of the source correlithm objects 104A and their corresponding target correlithm objects 104B from the entire correlithm object mapping table 200. For example, as illustrated in FIG. 6A, the second portion 200b includes source correlithm objects a-c and the corresponding target correlithm objects a-c. The n-th portion of the 200n includes an n-th subset of the source correlithm objects 104A and their corresponding target correlithm objects 104B from the entire correlithm object mapping table 200. For example, as illustrated in FIG. 6A, the n-th portion 200n includes source correlithm objects x-z and the corresponding target correlithm objects x-z. In some embodiments, the correlithm objects 104 included in the first, second, and n-th portions of the mapping table 200 are mutually exclusive of each other, or non-overlapping. In other embodiments, the correlithm objects 104 included in the first, second, and/or n-th portions of the mapping table 200 are overlapping or at least partially overlapping in order to achieve redundancy in the distance calculations between the input correlithm object 104 and the source correlithm objects 104A as detailed below.

The first, second, and n-th portions of mapping table 200 are each illustrated as having three source and target correlithm objects for illustrative purposes only. They may have any suitable number of correlithm objects 104 that may be the same or different from each other. In one embodiment, the number of correlithm objects 104 that are included in the first, second, and n-th portions of the mapping table 200 is determined based on the computing power of the corresponding calculation nodes 604a, 604b, and 604n, and/or the speed with which those nodes 604a-n can perform their processes. For example, the more computing power and/or speed that a particular node 604 can perform its processes, the larger number of correlithm objects 104 can be transmitted to that node 604 in the relevant portion of the mapping table 200.

Distribution node 602 transmits the first portion 200a of the correlithm object mapping table 200 to the first calculation node 604a, the second portion 200b to the second calculation node 604b, and the n-th portion 200n to the n-th calculation node 604n. After transmission, the first calculation node 604a stores, or otherwise has access to, the first portion 200a; the second calculation node 604b stores, or otherwise has access to, the second portion 200b; and the n-th calculation node 604n stores, or otherwise has access to, the n-th portion 200n. Although system 600 is primarily described as having distribution node 602 divide the mapping table 200 into portions 200a-n and transmit those portions 200a-n to corresponding calculation nodes 604a-n, it should be understood that the mapping table 200 can initially be created in multiple portions 200a-n and stored, or otherwise accessed by, calculation nodes 604a-n without the need to divide the mapping table 200 and transmit the portions 200a-n by the distribution node 602. Either approach achieves the technical advantages of parallel processing in computing the n-dimensional distances between the input correlithm object 104 and the source correlithm objects 104A in the portions 200a-n of the mapping table 200.

In operation, each of the calculation nodes 604a-n receives an input correlithm object 104. Although FIG. 6A illustrates nodes 604a-n receiving the input correlithm object 104 from distribution node 602, nodes 604a-n may receive input correlithm object 104 from any suitable sources including, but not limited to, distribution node 602. The input correlithm object 104 is an n-bit digital word comprising binary values. Each of the calculation nodes 604a-n determines the n-dimensional distance (e.g., Hamming distance, Minkowski distance, or other suitable distance calculation) between the input correlithm object 104 and the source correlithm objects 104A stored in the relevant portions 200a-n of the mapping table 200 for that node 604a-n. For example, calculation node 604a determines the n-dimensional distance between the input correlithm object 104 and the source correlithm objects 1-3 stored in the first portion 200a of the mapping table 200. With respect to calculating a Hamming distance, as described above with respect to at least FIG. 1, the determined n-dimensional distances are based on differences between the binary values representing the input correlithm object 104 and the binary values representing each source correlithm object 1-3 of the first portion 200a of the mapping table 200.

Calculation node 604a identifies the source correlithm object 1-3 with the closest n-dimensional distance (e.g., smallest Hamming distance) to the input correlithm object 104. Calculation node 604a further identifies the target correlithm object 104B that corresponds to the identified source correlithm object. In this example, assume that the correlithm objects described herein are 256-bit digital values. Further assume that the smallest Hamming distance is calculated to be 10 and is associated with source correlithm object 2. Calculation node 604a transmits the smallest calculated Hamming distance (i.e., 10) and the corresponding target correlithm object 2 to resolution node 606 for further processing, as detailed below.

Continuing with the example, calculation node 604b determines the n-dimensional distance between the input correlithm object 104 and the source correlithm objects a-c stored in the second portion 200b of the mapping table 200. With respect to calculating a Hamming distance, as described above with respect to at least FIG. 1, the determined n-dimensional distances are based on differences between the binary values representing the input correlithm object 104 and the binary values representing each source correlithm object a-c of the second portion 200b of the mapping table 200.

Calculation node 604b identifies the source correlithm object a-c with the closest n-dimensional distance (e.g., smallest Hamming distance) to the input correlithm object 104. Calculation node 604b further identifies the target correlithm object 104B that corresponds to the identified source correlithm object. In this example using 256-bit digital values for the correlithm objects, assume that the smallest Hamming distance is calculated to be 3 and is associated with source correlithm object c. Calculation node 604b transmits the smallest calculated Hamming distance (i.e., 3) and the corresponding target correlithm object c to resolution node 606 for further processing, as detailed below.

Continuing with the example, calculation node 604n determines the n-dimensional distance between the input correlithm object 104 and the source correlithm objects x-z stored in the n-th portion 200n of the mapping table 200. With respect to calculating a Hamming distance, as described above with respect to at least FIG. 1, the determined n-dimensional distances are based on differences between the binary values representing the input correlithm object 104 and the binary values representing each source correlithm object x-z of the n-th portion 200n of the mapping table 200.

Calculation node 604n identifies the source correlithm object x-z with the closest n-dimensional distance (e.g., smallest Hamming distance) to the input correlithm object 104. Calculation node 604n further identifies the target correlithm object 104B that corresponds to the identified source correlithm object. In this example using 256-bit digital values for the correlithm objects, assume that the smallest Hamming distance is calculated to be 45 and is associated with source correlithm object x. Calculation node 604n transmits the smallest calculated Hamming distance (i.e., 45) and the corresponding target correlithm object x to resolution node 606 for further processing, as detailed below.

Resolution node 606 determines the appropriate target correlithm object 104B to transmit as the output correlithm object 104 based on a comparison of the smallest calculated n-dimensional distances communicated by each of the calculation nodes 604a-n. In particular, resolution node 606 compares the determined n-dimensional distance (i.e., Hamming distance of 10) associated with the identified source correlithm object 2 from the first calculation node 604a, with the determined n-dimensional distance (i.e., Hamming distance of 3) associated with the identified source correlithm object c from the second calculation node 604b, and the determined n-dimensional distance (i.e., Hamming distance of 45) associated with the identified source correlithm object x from the n-th calculation node 604n. Resolution node 606 identifies the smallest determined n-dimensional distance among all of the distances transmitted to it based on this comparison. Accordingly, in this example, resolution node 606 determines that the smallest determined n-dimensional distance transmitted to it is a Hamming distance of 3 from second calculation node 604b. Resolution node 606 identifies the target correlithm object 104B associated with the smallest determined n-dimensional distance, and outputs the identified target correlithm object 104B as output correlithm object 104. In this example, resolution node 606 identifies the target correlithm object c as being associated with the smallest determined n-dimensional distance of 3 and communicates it as output correlithm object 104.

In the described example, this means that of all the source correlithm objects 104A stored in the different portions of the mapping table 200a-n, the input correlithm object 104 most closely matched the source correlithm object c in the second portion 200b of the mapping table 200. By dividing the mapping table 200 into smaller portions 200a-n, the process of determining the n-dimensional distances between the input correlithm object 104 and the source correlithm objects 104 was performed in parallel by calculation nodes 604a-n. Performing parallel processing, as described above, increases the speed and efficiency of calculating the n-dimensional distances between the input correlithm object 104 and the source correlithm objects of the mapping table 200. This reduces bottlenecks in the network and in the overall correlithm object processing system 600.

FIG. 6B illustrates an embodiment of correlithm object processing system 610 that operates in conjunction with an actor table 310 rather than a correlithm object mapping table 200. In this embodiment, actor table 310 is configured with a first column 202 that includes target correlithm objects 104B and a second column 204 that includes real world data values. The operation of system 610 in FIG. 6B is substantially similar to that of system 610 in FIG. 6A except that distribution node 602, calculation nodes 604a-n, and resolution node 606 operate using target correlithm objects 104B from actor table 310 in place of source correlithm objects 104A from mapping table 200, and they operate using real world data values from actor table 310 in place of target correlithm objects 104B from mapping table 200.

Figure 7:
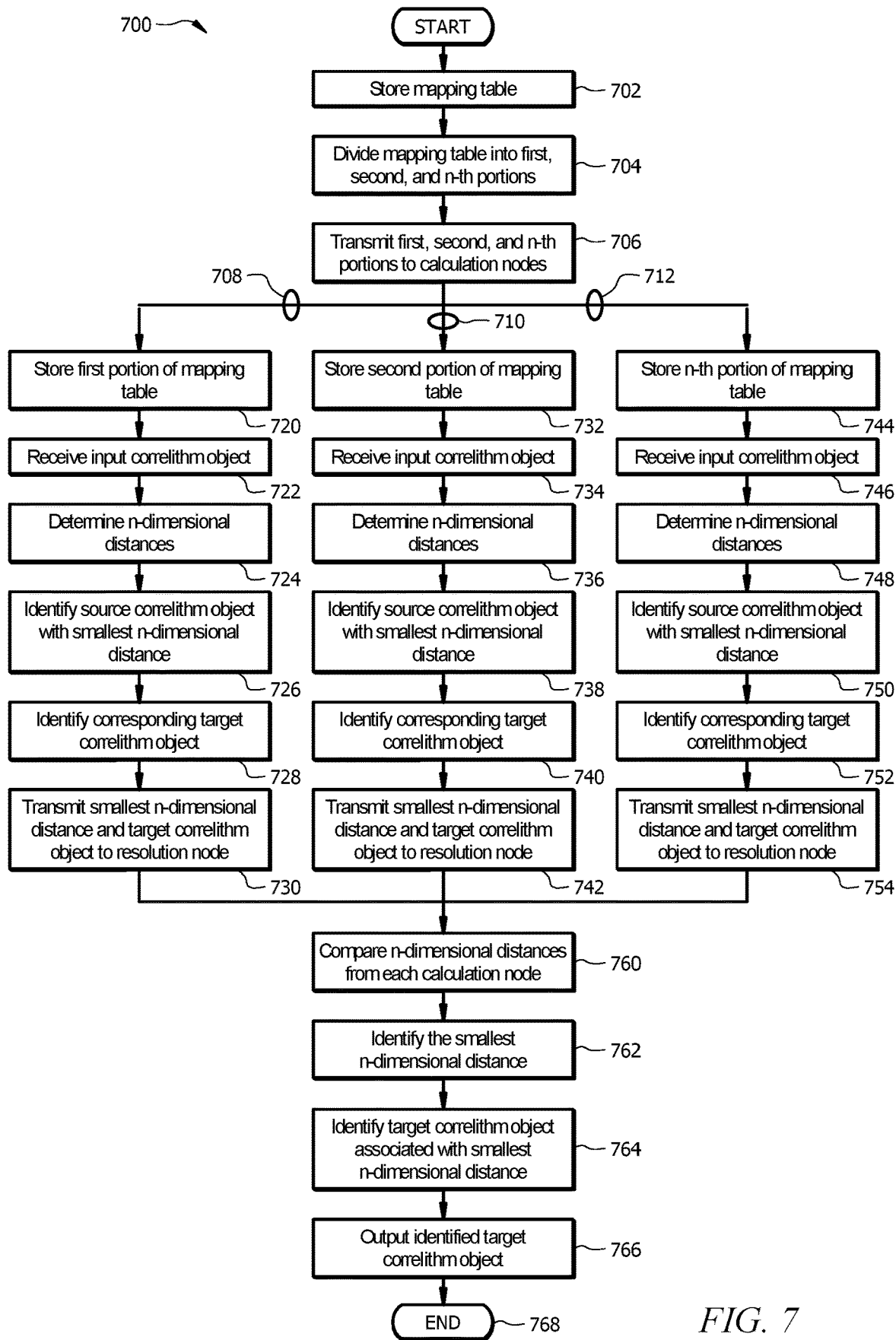
FIG. 7 illustrates one embodiment of a flowchart implementing a process performed by the components of the correlithm object processing system illustrated in FIGS. 6A-B.

FIG. 7 illustrates one embodiment of a flowchart 700 implementing a process performed by the components of correlithm object processing system 610. Upon starting the process, distribution node 602 stores correlithm object mapping table 200 at step 702. Mapping table 200 includes source correlithm objects 104A mapped to target correlithm objects 104B. Distribution node 602 divides mapping table 200 into multiple portions, such as first portion 200a, second portion 200b, and n-th portion 200n, at step 704. Each portion of mapping table 200 includes a subset of the source correlithm objects 104A and corresponding target correlithm objects 104B. Execution proceeds to step 706, where distribution node 602 transmits first portion 200a of mapping table 200 to first calculation node 604a, second portion 200b of mapping table 200 to second calculation node 604b, and n-th portion 200n of mapping table 200 to n-th calculation node 604n.

Execution proceeds in parallel according to processing path 708 associated with first calculation node 604a, path 710 associated with second calculation node 604b, and path 712 associated with n-th calculation node 604n. Notwithstanding the ordering of discussion with respect to the flowchart illustrated in FIG. 7, the processes described in each of the paths 708, 710, and 712 are performed substantially simultaneously. Furthermore, as described above, although the flowchart 700 is described as beginning with the operation of distribution node 602 dividing and transmitting portions of a mapping table 200 to calculation nodes 604a-n, it should be understood that in at least one embodiment, the process could start with portions of the mapping table 200 already stored or otherwise accessible by the appropriate calculation nodes 604a-n.

Referring to processing path 708, execution proceeds to step 720 where first calculation node 604a stores first portion 200a of mapping table 200. First calculation node 604a receives input correlithm object 104 at step 722. Execution proceeds to step 724 where first calculation node 604a determines n-dimensional distances between the input correlithm object 104 and each of the source correlithm objects 1-3 in the first portion 200a of the mapping table 200. The determined n-dimensional distances are based on differences between the binary values representing the input correlithm object 104 and the binary values representing each source correlithm object 1-3 of the first portion 200a of the mapping table 200. At step 726, first calculation node 604a identifies the smallest n-dimensional distance from among the determined distances, and identifies the source correlithm object 1-3 from the first portion 200a of the mapping table 200 that is the closest match to the input correlithm object 104. Execution proceeds to step 728 where first calculation node 604a identifies the target correlithm object 104B from the first portion 200a of the mapping table 200 that corresponds to the source correlithm object 104A identified at step 726. At step 730, first calculation node 604a transmits to resolution node 606 the target correlithm object 104B identified at step 728, and the smallest determined n-dimensional distance identified at step 726.

Referring to processing path 710, execution proceeds to step 732 where second calculation node 604b stores second portion 200b of mapping table 200. Second calculation node 604b receives input correlithm object 104 at step 734. Execution proceeds to step 736 where second calculation node 604b determines n-dimensional distances between the input correlithm object 104 and each of the source correlithm objects a-c in the second portion 200b of the mapping table 200. The determined n-dimensional distances are based on differences between the binary values representing the input correlithm object 104 and the binary values representing each source correlithm object a-c of the second portion 200b of the mapping table 200. At step 738, second calculation node 604b identifies the smallest n-dimensional distance from among the determined distances, and identifies the source correlithm object 104A from the second portion 200b of the mapping table 200 that is the closest match to the input correlithm object 104. Execution proceeds to step 740 where second calculation node 604b identifies the target correlithm object 104B from the second portion 200b of the mapping table 200 that corresponds to the source correlithm object 104A identified at step 738. At step 742, second calculation node 604b transmits to resolution node 606 the target correlithm object 104B identified at step 740, and the smallest determined n-dimensional distance identified at step 738.

Referring to processing path 712, execution proceeds to step 744 where n-th calculation node 604n stores n-th portion 200n of mapping table 200. N-th calculation node 604n receives input correlithm object 104 at step 746. Execution proceeds to step 748 where n-th calculation node 604n determines n-dimensional distances between the input correlithm object 104 and each of the source correlithm objects x-z in the n-th portion 200n of the mapping table 200. The determined n-dimensional distances are based on differences between the binary values representing the input correlithm object 104 and the binary values representing each source correlithm object x-z of the n-th portion 200n of the mapping table 200. At step 750, n-th calculation node 604n identifies the smallest n-dimensional distance from among the determined distances, and identifies the source correlithm object 104A from the n-th portion 200n of the mapping table 200 that is the closest match to the input correlithm object 104. Execution proceeds to step 752 where n-th calculation node 604n identifies the target correlithm object 104B from the n-th portion 200n of the mapping table 200 that corresponds to the source correlithm object 104A identified at step 750. At step 754, n-th calculation node 604n transmits to resolution node 606 the target correlithm object 104B identified at step 752 and the smallest determined n-dimensional distance identified at step 750.

Execution proceeds from paths 708, 710, and 712 to step 760 where resolution node 606 compares the n-dimensional distances transmitted by the first calculation node 604a, the second calculation node 604b, and the n-th calculation node 604n. At step 762, resolution node 606 identifies the smallest n-dimensional distance based on the comparison performed at step 760. Execution proceeds to step 764, where resolution node 606 identifies the target correlithm object 104B associated with the smallest n-dimensional distance determined at step 762. At step 766, resolution node 606 outputs the target correlithm object 104B identified at step 764. Execution terminates at step 768.

Referring now to FIG. 8A, distribution node 802 of system 810 stores a correlithm object mapping table 200 configured with a first column 202 that includes source correlithm objects 104A and a second column 204 that includes corresponding target correlithm objects 104B. Although table 200 is described with respect to columns 202 and 204, one of ordinary skill in the art will appreciate that any suitable organization of data or data structure that can map source correlithm objects 104A to target correlithm objects 104B can be used in system 810. The source correlithm objects 104A and target correlithm objects 104B each reside in the same or different n-dimensional spaces 102. In one embodiment, source correlithm objects 104A and target correlithm objects 104B are each n-bit digital words comprising binary values. For example, they may comprise 64-bit, 128-bit, or 256-bit digital words comprising a binary string of values.

As described above with respect to FIG. 3, a node 304 is generally configured to receive an input correlithm object 104, identify the source correlithm object 104A that most closely matches the input correlithm object 104, and output the target correlithm object 104B corresponding to the identified source correlithm object 104A. Finding the source correlithm object 104A that most closely matches the input correlithm object 104 may involve computing the n-dimensional distance (e.g., Hamming distance, Minkowski distance, or other suitable distance) between the input correlithm object 104 and each of the source correlithm objects 104A, and identifying the source correlithm object 104A that results in the smallest n-dimensional distance calculation. Performing this distance calculation serially for a relatively large number of source correlithm objects 104A in a relatively large correlithm object mapping table 200 can be time consuming, which can create bottlenecks in a correlithm object processing system. The present disclosure provides a technical solution whereby the n-dimensional distance calculation is performed using parallel processing techniques implemented by calculation nodes 804a-n, and resolution node 806, as described in greater detail below.

Distribution node 802 divides each source correlithm object 104A of mapping table 200 into any suitable number of portions, such as first portion 800a, second portion 800b, and n-th portion 800n. First portion 800a of a given source correlithm object 104A (e.g., source CO1) comprises a first subset of the n-bit digital word of binary values making up that source correlithm object 104A. For example, as illustrated in FIG. 8, if source CO1 is a 256-bit digital word of binary values, then first portion 800a of source CO1 may include the first 64 bits of that 256-bit digital word. Second portion 800b of that source correlithm object 104A (e.g., source CO1) comprises a second subset of the n-bit digital word of binary values making up that source correlithm object 104A. For example, as illustrated in FIG. 8, if source CO1 is a 256-bit digital word of binary values, then second portion 800b of source CO1 may include the second 64 bits of that 256-bit digital word. N-th portion 800n of that source correlithm object 104A (e.g., source CO1) comprises an n-th subset of the n-bit digital word of binary values making up that source correlithm object 104A. For example, as illustrated in FIG. 8, if source CO1 is a 256-bit digital word of binary values, then n-th portion 800n of source CO1 may include the last 128 bits of that 256-bit digital word. Each of the other source correlithm objects 104A stored in mapping table 200 (e.g., source CO2, source CO3, source COa, source COb, source COc, source COx, source COy, and source COz) may be similarly divided into first portions 800a, second portions 800b, and n-th portions 800n.

The source correlithm objects 104A are shown as being divided into three portions of 64-bit, 64-bit, and 128-bit sizes for illustrative purposes only. The source correlithm objects 104A may be divided into any suitable number of portions 800, each portion 800 having any suitable number of bits of the digital word. For example, a 256-bit source correlithm object 104A can be divided into four portions, each having 64 bits. In another non-limiting example, a 256-bit source correlithm object 104A can be divided into four portions having 64 bits, 32 bits, 128 bits, and 32 bits, respectively. In still another non-limiting example, a 256-bit source correlithm object 104A can be divided into ten portions, with nine of those portions having 25 bits and the tenth portion having 31 bits. The present disclosure contemplates any number of other combinations for the number of portions 800 and the size of each portion 800. In one embodiment, the number and sizes of portions 800 that are divided from the source correlithm object 104A in mapping table 200 are determined based on the computing power of the corresponding calculation nodes 804a, 804b, and 804n, and/or the speed with which those nodes 804a-n can perform their processes. For example, the more computing power and/or speed that a particular node 804 can perform its processes, the larger number of bits that can be included in a portion 800 that is transmitted to that node 804 for calculation.

Distribution node 802 transmits the first portion 800a of each source correlithm object 104A in mapping table 200 to the first calculation node 804a, the second portion 800b of each source correlithm object 104A in mapping table 200 to the second calculation node 804b, and the n-th portion 200n of each source correlithm object 104A in mapping table 200 to the n-th calculation node 804n. After transmission, the first calculation node 804a stores, or otherwise has access to, the first portions 800a; the second calculation node 804b stores, or otherwise has access to, the second portions 800a; and the n-th calculation node 804n stores, or otherwise has access to, the n-th portions 800n. Although system 800 is primarily described as having distribution node 802 divide the source correlithm objects 104A in mapping table 200 into portions 800a-n and transmit those portions 200a-n to corresponding calculation nodes 804a-n, it should be understood that the source correlithm objects 104A can initially be created already divided and stored, or otherwise accessible by, calculation nodes 804a-n without the need for distribution node 802 to divide and transmit them to the calculation nodes 804a-n. Either approach achieves the technical advantages of parallel processing, as detailed below.

In operation, each of the calculation nodes 804a-n receives an input correlithm object 104 (or at least a portion thereof). In the example described below, the input correlithm object 104 is a 256-bit digital word of binary values. Although FIG. 8 illustrates nodes 804a-n receiving the input correlithm object 104 from distribution node 802, nodes 804a-n may receive input correlithm object 104 from any suitable sources including, but not limited to, distribution node 802. The input correlithm object 104 is an n-bit digital word comprising binary values.

Each of the calculation nodes 804a-n determines the n-dimensional distance (e.g., Hamming distance, Minkowski distance, or other suitable distance calculation) between the relevant bits of the input correlithm object 104 and the relevant portions 800a-n of each source correlithm object 104A. For example, calculation node 804a determines the n-dimensional distance between the first 64 bits of input correlithm object 104 and the first portion 800a of each source correlithm object 104, which in this example is also 64 bits. Thus, in the example illustrated in FIG. 8, calculation node 804a calculates nine n-dimensional distances, one each for the first portions 800a of source correlithm objects 1-3, source correlithm objects a-c, and source correlithm objects x-z. Similarly, calculation node 804a determines the n-dimensional distance between the next 64 bits of input correlithm object 104 and the second portion 800a of each source correlithm object 104, which in this example is also 64 bits. Thus, in the example illustrated in FIG. 8, calculation node 804b calculates nine n-dimensional distances, one each for the second portions 800b of source correlithm objects 1-3, source correlithm objects a-c, and source correlithm objects x-z. Finally, calculation node 804n determines the n-dimensional distance between the last 128 bits of input correlithm object 104 and the n-th portion 800n of each source correlithm object 104, which in this example is also 128 bits. Thus, in the example illustrated in FIG. 8, calculation node 804n calculates nine n-dimensional distances, one each for the first portions 800n of source correlithm objects 1-3, source correlithm objects a-c, and source correlithm objects x-z. With respect to calculating a Hamming distance, as described above with respect to at least FIG. 1, the determined n-dimensional distances are based on differences between the binary values representing the input correlithm object 104 and the binary values representing each of the portions 800a-n of the source correlithm objects. Each calculation node 804a-n transmits the determined n-dimensional distance values to the resolution node 806 for further processing, as detailed below.

Resolution node 806 receives the n-dimensional distance calculations from each of the calculation nodes 804a-n and adds them together for each source correlithm object 104A. For example, resolution node 806 adds together the n-dimensional distance determined for the first portion 800a of source correlithm object 1 with the n-dimensional distance determined for the second portion 800a of source correlithm object 1 and the n-dimensional distance determined for the n-th portion 800n of source correlithm object 1. Likewise, resolution node 806 adds together the n-dimensional distances together for the first portion 800a, second portion 800b, and n-th portion 800n of source correlithm object 2. Resolution node 806 further adds together the n-dimensional distances of the portions 800a, 800b, and 800n for each of the other source correlithm objects (e.g., source correlithm object 3, source correlithm objects a-c, and source correlithm objects x-z). Thus, in this particular example, resolution node 806 will have calculated nine separate n-dimensional distances based on these calculations, one each for the source correlithm objects 104A in mapping table 200. In a particular embodiment, these n-dimensional distances may be represented as Hamming distances and added together as such. In other embodiments, they may be Minkowski distances, or any other suitable form of measurement for n-dimensional distances.

Resolution node 806 then compares the determined n-dimensional distances to identify the source correlithm object 104A with the smallest n-dimensional distance to the input correlithm object 104. For example, if the n-dimensional distances are measured using Hamming distances, then resolution node 806 will compare the aggregate Hamming distances calculated for each of the nine source correlithm objects 1-3, a-c, and x-z, to determine which source correlithm object 104A has the smallest Hamming distance. Resolution node 806 then identifies the target correlithm object 104B that corresponds to the identified source correlithm object 104A with the smallest n-dimensional distance to the input correlithm object 104, and communicates that target correlithm object 104B as output correlithm object 104. In a particular embodiment, resolution node 806 stores a copy of the mapping table 200 so it can look up which target correlithm object 104B corresponds to the identified source correlithm object 104A.

By dividing each of the source correlithm objects 104A in mapping table 200 into smaller portions 800a-n, the process of determining the n-dimensional distances between the input correlithm object 104 and the source correlithm objects 104 was performed in parallel by calculation nodes 804a-n. In other words, each calculation node 804 performed an n-dimensional distance calculation on a subset of bits of each source correlithm object 104A. Performing parallel processing, as described above, increases the speed and efficiency of calculating the n-dimensional distances between the input correlithm object 104 and the source correlithm objects 104A of the mapping table 200. This reduces bottlenecks in the network and in the overall correlithm object processing system 810.

FIG. 8B illustrates an embodiment of correlithm object processing system 810 that operates in conjunction with an actor table 310 rather than a correlithm object mapping table 200. In this embodiment, actor table 310 is configured with a first column 202 that includes target correlithm objects 104B and a second column 204 that includes real world data values. The operation of system 810 in FIG. 8B is substantially similar to that of system 810 in FIG. 8A except that distribution node 802, calculation nodes 804a-n, and resolution node 806 operate using target correlithm objects 104B from actor table 310 in place of source correlithm objects 104A from actor table 200, and they operate using real world data values from mapping table 310 in place of target correlithm objects 104B from mapping table 200.

Referring now to FIG. 9A, distribution node 902 stores a correlithm object mapping table 200 configured with a first column 202 that includes source correlithm objects 104A and a second column 204 that includes corresponding target correlithm objects 104B. Although table 200 is described with respect to columns 202 and 204, one of ordinary skill in the art will appreciate that any suitable organization of data or data structure that can map source correlithm objects 104A to target correlithm objects 104B can be used in system 910. The source correlithm objects 104A and target correlithm objects 104B each reside in the same or different n-dimensional spaces 102. In one embodiment, source correlithm objects 104A and target correlithm objects 104B are each n-bit digital words comprising binary values. For example, they may comprise 64-bit, 128-bit, or 256-bit digital words comprising a binary string of values.

As described above with respect to FIG. 3, a node 304 is generally configured to receive an input correlithm object 104, identify the source correlithm object 104A that most closely matches the input correlithm object 104, and output the target correlithm object 104B corresponding to the identified source correlithm object 104A. Finding the source correlithm object 104A that most closely matches the input correlithm object 104 may involve computing the n-dimensional distance (e.g., Hamming distance, Minkowski distance, or other suitable distance) between the input correlithm object 104 and each of the source correlithm objects 104A, and identifying the source correlithm object 104A that results in the smallest n-dimensional distance calculation. Performing this distance calculation serially for a relatively large number of source correlithm objects 104A in a relatively large correlithm object mapping table 200 can be time consuming, which can create bottlenecks in a correlithm object processing system. The present disclosure provides a technical solution whereby the n-dimensional distance calculation is performed using parallel processing techniques implemented by calculation nodes 904a-n, and resolution node 906, as described in greater detail below.

Distribution node 902 stores a multi-input mapping table 200 whereby each target correlithm object 104B corresponds to a plurality of source correlithm objects 104A. For example, in the first row of mapping table 200, target correlithm object 1 corresponds to source correlithm object 1-1, source correlithm object 1-2, and source correlithm object 1-n. Similarly, in the second row of mapping table 200, target correlithm object 2 corresponds to source correlithm object 2-1, source correlithm object 2-2, and source correlithm object 2-n. In the remainder of rows in mapping table 200, each target correlithm object 104B corresponds to multiple source correlithm objects 104A, as illustrated. Accordingly, the mapping table 200 includes a plurality of first source correlithm objects 900a, a plurality of second source correlithm objects 900b, and a plurality of n-th source correlithm objects 900n.

Mapping table 200 is illustrated as having three source correlithm objects 104A corresponding to each target correlithm object 104B. However, the present disclosure contemplates any suitable number of source correlithm objects 104A corresponding to each target correlithm object 104B. The number of source correlithm objects 104A that correspond to each target correlithm object 104B in mapping table 200 of FIG. 9A could be based on the computing power of the corresponding calculation nodes 904a, 904b, and 904n, and/or the speed with which those nodes 904a-n can perform their processes.

Distribution node 902 transmits the plurality of first source correlithm objects 900a to the first calculation node 904a, the plurality of second source correlithm objects 900b to the second calculation node 904b, and the plurality of n-th source correlithm objects 900n to the n-th calculation node 904n. After transmission, the first calculation node 904a stores, or otherwise has access to, the plurality of first source correlithm objects 900a; the second calculation node 904b stores, or otherwise has access to, the plurality of second source correlithm objects 900b; and the n-th calculation node 904n stores, or otherwise has access to, the plurality of n-th source correlithm objects 900n. Although system 910 is primarily described as having distribution node 902 transmit the plurality of source correlithm objects 900a, 900b, and 900n to corresponding calculation nodes 904a-n, it should be understood that the plurality of source correlithm objects 900a, 900b, and 900n can initially be stored, or otherwise accessible by, calculation nodes 904a-n without the need for distribution node 902 to transmit them to the calculation nodes 904a-n. Either approach achieves the technical advantages of parallel processing, as detailed below.

In operation, each of the calculation nodes 904a-n receives a corresponding input correlithm object 104a-n. In particular, calculation node 904a receives a first input correlithm object 104a; calculation node 904b receives a second input correlithm object 104b; and calculation node 904n receives an n-th input correlithm object 104n. Although FIG. 9A illustrates nodes 904a-n receiving the input correlithm objects 104a-n from distribution node 902, nodes 904a-n may receive input correlithms objects 104a-n from any suitable sources including, but not limited to, distribution node 902. The input correlithm objects 104a-n are n-bit digital word comprising binary values.

Each of the calculation nodes 904a-n determines the n-dimensional distance (e.g., Hamming distance, Minkowski distance, or other suitable distance calculation) between the relevant input correlithm object 104a-n and the relevant plurality of source correlithm objects 900a-n. For example, calculation node 904a determines the n-dimensional distance between the first input correlithm object 104a and each of the plurality of first source correlithm objects 900a. Thus, in the example illustrated in FIG. 9A, calculation node 904a calculates nine n-dimensional distances, one each for the source correlithm objects 104A within the group of source correlithm objects 900a. Similarly, calculation node 904b determines the n-dimensional distance between the second input correlithm object 104b and each of the plurality of second source correlithm objects 900b. Thus, in the example illustrated in FIG. 9, calculation node 904b calculates nine n-dimensional distances, one each for the source correlithm objects 104A within the group of source correlithm objects 900a. Finally, calculation node 904n determines the n-dimensional distance between the n-th input correlithm object 104n and each of the plurality of n-th source correlithm objects 900n. Thus, in the example illustrated in FIG. 9A, calculation node 904n calculates nine n-dimensional distances, one each for the source correlithm objects 104A within the group of source correlithm objects 900n. With respect to calculating a Hamming distance, as described above with respect to at least FIG. 1, the determined n-dimensional distances are based on differences between the binary values representing the input correlithm objects 104a-n and the binary values representing each of the source correlithm objects 104A within the corresponding groups of sources correlithm objects 900a-n. Each calculation node 904a-n transmits the determined n-dimensional distance values to the resolution node 906 for further processing, as detailed below.

Resolution node 906 receives the n-dimensional distance calculations from each of the calculation nodes 904a-n and adds them together for each set of corresponding source correlithm objects 104A. For example, resolution node 906 adds together the n-dimensional distance determined for the source correlithm object 1-1 with the n-dimensional distance determined for the source correlithm object 1-2 and the n-dimensional distance determined for source correlithm object 1-n. Likewise, resolution node 906 adds together the n-dimensional distances together for the source correlithm object 2-1, source correlithm object 2-2, and source correlithm object 2-n. Resolution node 906 further adds together the n-dimensional distances of each of the other corresponding rows of source correlithm objects 104A in mapping table 200. Thus, in this particular example, resolution node will have calculated nine separate n-dimensional distances based on these calculations, one each for each row of source correlithm objects 104A in mapping table 200. In a particular embodiment, these n-dimensional distances may be represented as Hamming distances and added together as such. In other embodiments, they may be Minkowski distances, or any other suitable form of measurement for n-dimensional distances.

Resolution node 906 then compares the determined n-dimensional distances to identify the row of source correlithm objects 104A with the smallest aggregate n-dimensional distances to the input correlithm objects 104a-n. For example, if the n-dimensional distances are measured using Hamming distances, then resolution node 906 will compare the aggregate Hamming distances calculated for each of the nine rows of source correlithm objects 104A in mapping table 200, to determine which row of source correlithm objects 104A has the smallest aggregate Hamming distance. Resolution node 906 then identifies the target correlithm object 104B that corresponds to the identified row of source correlithm objects 104 with the smallest aggregate n-dimensional distance to the input correlithm objects 104a-n, and communicates that target correlithm object 104B as output correlithm object 104. In a particular embodiment, resolution node 906 stores a copy of the mapping table 200 so it can look up which target correlithm object 104B corresponds to the identified row of source correlithm objects 104A.

In system 910, the process of determining the n-dimensional distances between the input correlithm objects 104a-n and the groups of source correlithm objects 900a, 900b, and 900n is performed in parallel by calculation nodes 904a-n. Performing parallel processing, as described above, increases the speed and efficiency of calculating the n-dimensional distances between the input correlithm objects 104a-n and the source correlithm objects 104A of the mapping table 200. This reduces bottlenecks in the network and in the overall correlithm object processing system 910.

FIG. 9B illustrates an embodiment of correlithm object processing system 910 that operates in conjunction with an actor table 310 rather than a correlithm object mapping table 200. In this embodiment, actor table 310 is configured with a first column 202 that includes target correlithm objects 104B and a second column 204 that includes real world data values. The operation of system 910 in FIG. 9B is substantially similar to that of system 910 in FIG. 9A except that distribution node 902, calculation nodes 904a-n, and resolution node 906 operate using target correlithm objects 104B from actor table 310 in place of source correlithm objects 104A from mapping table 200, and they operate using real world data values from actor table 310 in place of target correlithm objects 104B from mapping table 200.

Figure 10:
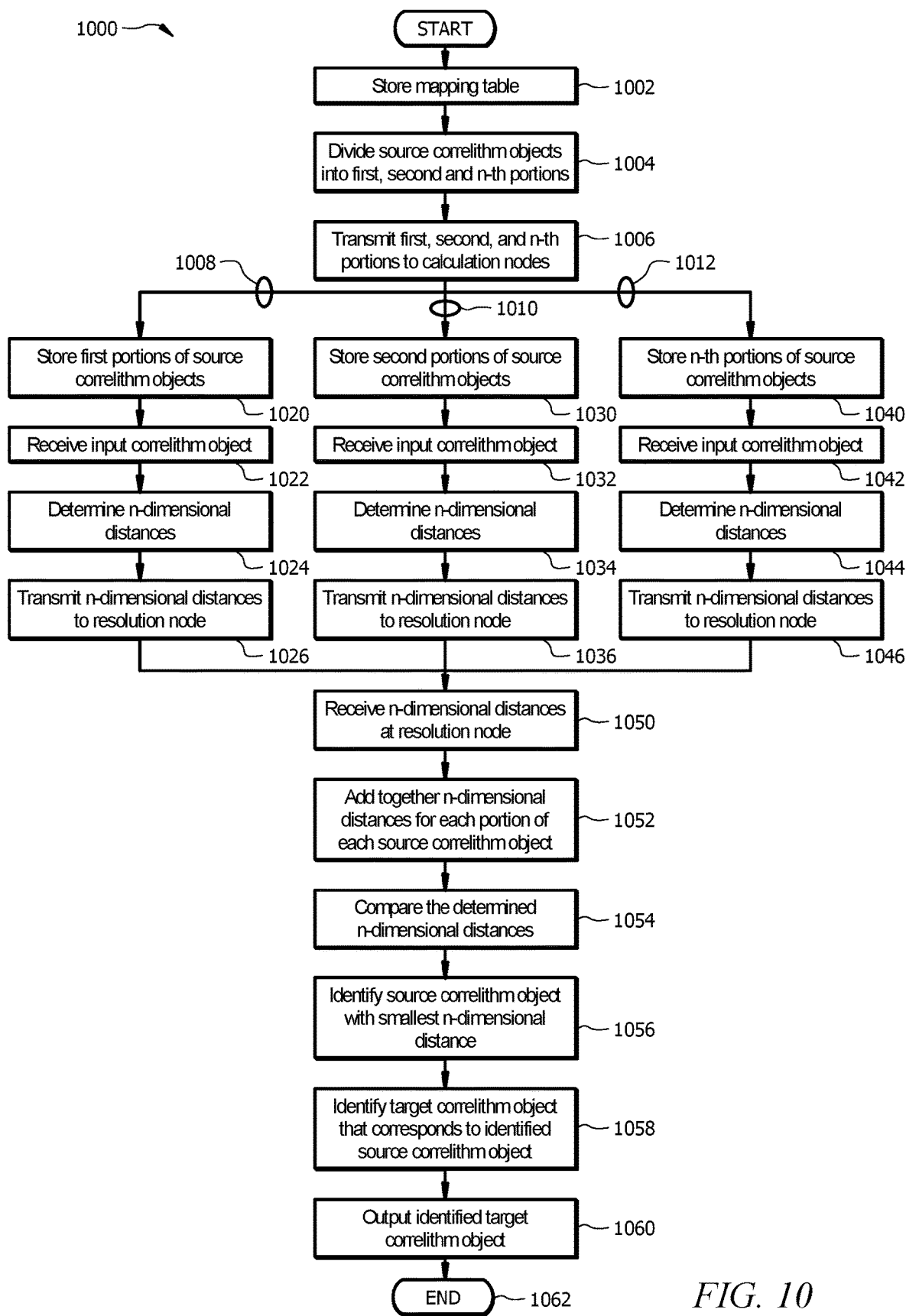
FIG. 10 illustrates one embodiment of a flowchart implementing a process performed by the components of the correlithm object processing system illustrated in FIGS. 8A-B.

FIG. 10 illustrates one embodiment of a flowchart 1000 implementing a process performed by the components of correlithm object processing system 810. Upon starting the process, distribution node 802 stores correlithm object mapping table 200 at step 1002. Mapping table 200 includes source correlithm objects 104A mapped to target correlithm objects 104B. Distribution node 802 divides each source correlithm object 104A into any suitable number of portions, such as a first portion 800a, a second portion 800b, and an n-th portion 800n, at step 1004. Each portion comprises a subset of the binary values in that source correlithm object 104A. Execution proceeds to step 1006, distribution node 802 transmits the first portion 800a to first calculation node 804a; transmits the second portion 800b to second calculation node 804b; and transmits the n-th portion 800n to n-th calculation node 800n.

Execution proceeds in parallel according to processing path 1008 associated with first calculation node 804a, path 1010 associated with second calculation node 804b, and path 1012 associated with n-th calculation node 804n. Notwithstanding the ordering of discussion with respect to the flowchart illustrated in FIG. 10, the processes described in each of the paths 1008, 1010, and 1012 are performed substantially simultaneously. Furthermore, as described above, although the flowchart 1000 is described as beginning with the operation of distribution node 802 dividing and transmitting source correlithm objects 104A from mapping table 200 to calculation nodes 804a-n, it should be understood that in at least one embodiment, the process could start with source correlithm objects 104A already divided into portions 800a-n and stored or otherwise accessible by the appropriate calculation nodes 804a-n.

Referring to processing path 1008, execution proceeds to step 1020 where first calculation node 804a stores first portion 800a of each source correlithm object 104A from mapping table 200. First calculation node 804a receives input correlithm object 104 at step 1022. Execution proceeds to step 1024 where first calculation node 804a determines n-dimensional distances between the input correlithm object 104 and the first portion 800a of each source correlithm object 104A from mapping table 200. The determined n-dimensional distances are based on differences between the binary values representing the input correlithm object 104 and the binary values representing the first portion 800a of each source correlithm object 104A from mapping table 200. At step 1026, first calculation node 804a transmits the determined n-dimensional distances for the first portions 800a of the source correlithm objects 104A to resolution node 806.

Referring to processing path 1010, execution proceeds to step 1030 where first calculation node 804a stores second portion 800b of each source correlithm object 104A from mapping table 200. Second calculation node 804b receives input correlithm object 104 at step 1032. Execution proceeds to step 1034 where second calculation node 804b determines n-dimensional distances between the input correlithm object 104 and the second portion 800b of each source correlithm object 104A from mapping table 200. The determined n-dimensional distances are based on differences between the binary values representing the input correlithm object 104 and the binary values representing the second portion 800b of each source correlithm object 104A from mapping table 200. At step 1036, second calculation node 804b transmits the determined n-dimensional distances for the second portions 800b of the source correlithm objects 104A to resolution node 806.

Referring to processing path 1012, execution proceeds to step 1040 where n-th calculation node 804n stores n-th portion 800n of each source correlithm object 104A from mapping table 200. N-th calculation node 804n receives input correlithm object 104 at step 1042. Execution proceeds to step 1044 where n-th calculation node 804n determines n-dimensional distances between the input correlithm object 104 and the n-th portion 800n of each source correlithm object 104A from mapping table 200. The determined n-dimensional distances are based on differences between the binary values representing the input correlithm object 104 and the binary values representing the n-th portion 800n of each source correlithm object 104A from mapping table 200. At step 1046, n-th calculation node 804n transmits the determined n-dimensional distances for the n-th portions 800n of the source correlithm objects 104A to resolution node 806.

Execution proceeds from paths 1008, 1010, and 1012 to step 1050 where resolution node 806 receives the n-dimensional distances transmitted at steps 1026, 1036, and 1046. At step 1052, for each source correlithm object 104A, resolution node 806 adds together the n-dimensional distances determined for the portions 800a-n of that source correlithm object 104a. Thus, for example, resolution node 806 adds together the n-dimensional distance determined for the first portion 800a of the first source correlithm object 104A with the n-dimensional distance determined for the second portion 800b of the first source correlithm object 104A and the n-dimensional distance determined for the n-th portion 800n of the first source correlithm object 104A. Resolution node 806 also adds together the n-dimensional distance determined for the first portion 800a of the second source correlithm object 104A with the n-dimensional distance determined for the second portion 800b of the second source correlithm object 104A and the n-dimensional distance determined for the n-th portion 800n of the second source correlithm object 104A. Resolution node 806 conducts this process of adding together the n-dimensional distances for the portions 800a-n for each of the remainder of source correlithm objects 104A at step 1052.

Execution proceeds to step 1054, where resolution node 806 compares the n-dimensional distances determined at step 1052 to each other to find the smallest determined n-dimensional distance. At step 1056, resolution node 806 identifies the source correlithm object 104A corresponding to the smallest determined n-dimensional distance. This identified source correlithm object is the closest match to the input correlithm object 104 among all of the source correlithm objects 104A in the mapping table 200. At step 1058, resolution node 806 then refers to the mapping table 200 to identify the target correlithm object 104B associated with the source correlithm object 104A identified at step 1056, and outputs that target correlithm object 104B as an output at step 1060. Execution terminates at step 1062.

Figure 11:
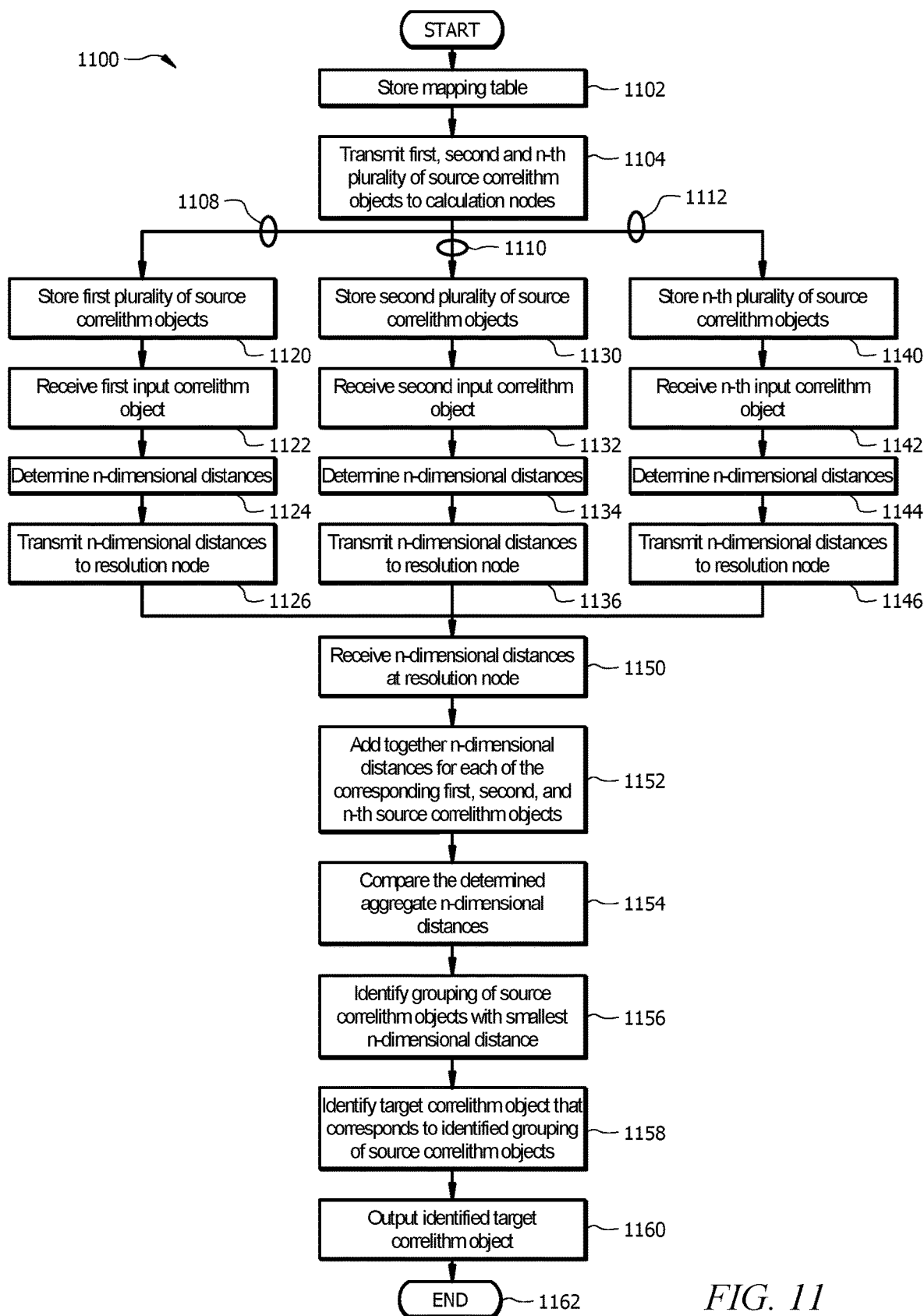
FIG. 11 illustrates one embodiment of a flowchart implementing a process performed by the components of the correlithm object processing system illustrated in FIGS. 9A-B.

FIG. 11 illustrates one embodiment of a flowchart 1100 implementing a process performed by the components of correlithm object processing system 910. Upon starting the process, distribution node 902 stores a multi-input correlithm object mapping table 200 at step 1102. Mapping table 200 includes a plurality of first source correlithm objects 900a, a plurality of second source correlithm objects 900b, a plurality of n-th source correlithm objects 900n, and a corresponding plurality of target correlithm objects 104B. Each correlithm object 104 comprises an n-bit digital word of binary values. Execution proceeds to step 1104 where distribution node 902 transmits the first plurality of source correlithm objects 900a to first calculation node 904a; transmits the second plurality of source correlithm objects 900b to second calculation node 904b; and transmits the n-th plurality of source correlithm objects 900n to n-th calculation node 900n.

Execution proceeds in parallel according to processing path 1108 associated with first calculation node 904a, path 1110 associated with second calculation node 904b, and path 1112 associated with n-th calculation node 904n. Notwithstanding the ordering of discussion with respect to the flowchart illustrated in FIG. 11, the processes described in each of the paths 1108, 1110, and 1112 are performed substantially simultaneously. Furthermore, as described above, although the flowchart 1100 is described as beginning with the operation of distribution node 902 transmitting plurality of source correlithm objects 900a-n to calculation nodes 904a-n, it should be understood that in at least one embodiment, the process could start with plurality of source correlithm objects 900a-n already stored or otherwise accessible by the appropriate calculation nodes 904a-n.

Referring to processing path 1108, execution proceeds to step 1120 where first calculation node 904a stores first plurality of source correlithm objects 900a from mapping table 200. First calculation node 904a receives first input correlithm object 104 at step 1122. Execution proceeds to step 1124 where first calculation node 904a determines n-dimensional distances between the first input correlithm object 104 and each of the first plurality of source correlithm objects 900a. The determined n-dimensional distances are based on differences between the binary values representing the first input correlithm object 104 and the binary values representing each of the first plurality of source correlithm objects 900a from mapping table 200. At step 1126, first calculation node 904a transmits the determined n-dimensional distances for the first plurality of source correlithm objects 900a to resolution node 906.

Referring to processing path 1110, execution proceeds to step 1130 where second calculation node 904b stores second plurality of source correlithm objects 900b from mapping table 200. Second calculation node 904b receives second input correlithm object 104 at step 1132. Execution proceeds to step 1134 where second calculation node 904b determines n-dimensional distances between the second input correlithm object 104 and each of the second plurality of source correlithm objects 900b. The determined n-dimensional distances are based on differences between the binary values representing the second input correlithm object 104 and the binary values representing each of the second plurality of source correlithm objects 900b from mapping table 200. At step 1136, second calculation node 904b transmits the determined n-dimensional distances for the second plurality of source correlithm objects 900b to resolution node 906.

Referring to processing path 1112, execution proceeds to step 1140 where n-th calculation node 904n stores n-th plurality of source correlithm objects 900n from mapping table 200. N-th calculation node 904n receives n-th input correlithm object 104 at step 1142. Execution proceeds to step 1144 where n-th calculation node 904n determines n-dimensional distances between the n-th input correlithm object 104 and each of the n-th plurality of source correlithm objects 900n. The determined n-dimensional distances are based on differences between the binary values representing the n-th input correlithm object 104 and the binary values representing each of the n-th plurality of source correlithm objects 900n from mapping table 200. At step 1146, n-th calculation node 904n transmits the determined n-dimensional distances for the n-th plurality of source correlithm objects 900n to resolution node 906.

Execution proceeds from paths 1108, 1110, and 1112 to step 1150 where resolution node 906 receives the n-dimensional distances transmitted at steps 1126, 1136, and 1146. At step 1152, resolution node 906 adds together the n-dimensional distances for each of the corresponding first, second, and n-th plurality of source correlithm objects 900a-n. In particular, resolution node 906 adds together the determined n-dimensional distance for each of the first plurality of source correlithm objects 900a with the n-dimensional distances determined for each of the corresponding second plurality of source correlithm objects 900b and with the n-dimensional distances determined for each of the corresponding n-th plurality of source correlithm objects 900n, such that each grouping of first, second, and n-th plurality of source correlithm objects 900a-n has an aggregate n-dimensional distance calculation. Thus, for example, the n-dimensional distances for Source CO1-1, Source CO1-2, and Source CO 1-n are added together such that this grouping of source correlithm objects has an aggregate n-dimensional distance calculation. The same calculations are made for Source CO2-1, Source CO2-2, and Source CO2-n; and so on for each remaining group of source correlithm objects in mapping table 200.

Execution proceeds to step 1154, where resolution node 906 compares to each other the aggregate n-dimensional distance calculations determined at step 1152 for each grouping of source correlithm objects to find the grouping with the smallest aggregate n-dimensional distance calculation. At step 1156, resolution node 906 identifies the grouping of source correlithm objects corresponding to the smallest aggregate n-dimensional distance calculation. This identified grouping of source correlithm objects is the closest match to the first, second, and n-th input correlithm objects 104 among all of the groupings of source correlithm objects 104A in the mapping table 200. At step 1158, resolution node 906 then refers to the mapping table 200 to identify the target correlithm object 104B associated with the grouping of source correlithm objects 104A identified at step 1156, and outputs that target correlithm object 104B as an output at step 1160. Execution terminates at step 1162.

Referring now to FIG. 12A, distribution node 1202 stores a correlithm object mapping table 200 configured with a first column 202 that includes source correlithm objects 104A and a second column 204 that includes corresponding target correlithm objects 104B. Although table 200 is described with respect to columns 202 and 204, one of ordinary skill in the art will appreciate that any suitable organization of data or data structure that can map source correlithm objects 104A to target correlithm objects 104B can be used in system 1210. The source correlithm objects 104A and target correlithm objects 104B each reside in the same or different n-dimensional spaces 102. In one embodiment, source correlithm objects 104A and target correlithm objects 104B are each n-bit digital words comprising binary values. For example, they may comprise 64-bit, 128-bit, or 256-bit digital words comprising a binary string of values.

As described above with respect to FIG. 3, a node 304 is generally configured to receive an input correlithm object 104, identify the source correlithm object 104A that most closely matches the input correlithm object 104, and output the target correlithm object 104B corresponding to the identified source correlithm object 104A. Finding the source correlithm object 104A that most closely matches the input correlithm object 104 may involve computing the n-dimensional distance (e.g., Hamming distance, Minkowski distance, or other suitable distance) between the input correlithm object 104 and each of the source correlithm objects 104A, and identifying the source correlithm object 104A that results in the smallest n-dimensional distance calculation. Performing this distance calculation serially for a relatively large number of source correlithm objects 104A in a relatively large correlithm object mapping table 200 can be time consuming, which can create bottlenecks in a correlithm object processing system. The present disclosure provides a technical solution whereby the n-dimensional distance calculation is performed using parallel processing techniques implemented by intermediate calculation nodes 1212a-n, final calculation nodes 1214a-n, and resolution node 1206, as described in greater detail below.

Distribution node 1202 divides each source correlithm object 104A of mapping table 200 into any suitable number of portions, such as first portion 800a, second portion 800b, and n-th portion 800n. First portion 800a of a given source correlithm object 104A (e.g., source CO1) comprises a first subset of the n-bit digital word of binary values making up that source correlithm object 104A. For example, as illustrated in FIG. 12A, if source CO1 is a 256-bit digital word of binary values, then first portion 800a of source CO1 may include the first 64 bits of that 256-bit digital word. Second portion 800b of that source correlithm object 104A (e.g., source CO1) comprises a second subset of the n-bit digital word of binary values making up that source correlithm object 104A. For example, as illustrated in FIG. 12A, if source CO1 is a 256-bit digital word of binary values, then second portion 800b of source CO1 may include the second 64 bits of that 256-bit digital word. N-th portion 800n of that source correlithm object 104A (e.g., source CO1) comprises an n-th subset of the n-bit digital word of binary values making up that source correlithm object 104A. For example, as illustrated in FIG. 12A, if source CO1 is a 256-bit digital word of binary values, then n-th portion 800n of source CO1 may include the last 128 bits of that 256-bit digital word. Each of the other source correlithm objects 104A stored in mapping table 200 (e.g., source CO2, source CO3, source COa, source COb, source COc, source COx, source COy, and source COz) may be similarly divided into first portions 800a, second portions 800b, and n-th portions 800n.

The source correlithm objects 104A are shown as being divided into three portions of 64-bit, 64-bit, and 128-bit sizes for illustrative purposes only. The source correlithm objects 104A may be divided into any suitable number of portions 800, each portion 800 having any suitable number of bits of the digital word. For example, a 256-bit source correlithm object 104A can be divided into four portions, each having 64 bits. In another non-limiting example, a 256-bit source correlithm object 104A can be divided into four portions having 64 bits, 32 bits, 128 bits, and 32 bits, respectively. In still another non-limiting example, a 256-bit source correlithm object 104A can be divided into ten portions, with nine of those portions having 25 bits and the tenth portion having 31 bits. The present disclosure contemplates any number of other combinations for the number of portions 800 and the size of each portion 800. In one embodiment, the number and sizes of portions 800 that are divided from the source correlithm object 104A in mapping table 200 are determined based on the computing power of the corresponding intermediate calculation nodes 1212a, 1212b, and 1212n, and/or the speed with which those nodes 1212a-n can perform their processes. For example, the more computing power and/or speed that a particular node 1212 can perform its processes, the larger number of bits that can be included in a portion 800 that is transmitted to that node 1212 for calculation.

Distribution node 1202 transmits the first portion 800a of each source correlithm object 104A in mapping table 200 to the first calculation node 1212a, the second portion 800b of each source correlithm object 104A in mapping table 200 to the second calculation node 1212b, and the n-th portion 200n of each source correlithm object 104A in mapping table 200 to the n-th calculation node 1212n. After transmission, the first calculation node 1212a stores, or otherwise has access to, the first portions 800a; the second calculation node 1212b stores, or otherwise has access to, the second portions 800a; and the n-th calculation node 1212n stores, or otherwise has access to, the n-th portions 800n. Although system 1210 is primarily described as having distribution node 1202 divide the source correlithm objects 104A in mapping table 200 into portions 800a-n and transmit those portions 200a-n to corresponding intermediate calculation nodes 1212a-n, it should be understood that the source correlithm objects 104A can initially be created already divided and stored, or otherwise accessible by, intermediate calculation nodes 1212a-n without the need for distribution node 1202 to divide and transmit them to the intermediate calculation nodes 1212a-n. Either approach achieves the technical advantages of parallel processing, as detailed below.

Distribution node 1202 also divides correlithm object mapping table 200 into any suitable number of portions, such as first portion 200a of the correlithm object mapping table 200, a second portion 200b of the correlithm object mapping table 200, and an n-th portion 200n of the correlithm object mapping table 200. The first portion 200a includes a first subset of the source correlithm objects 104A and their corresponding target correlithm objects 104B from the entire correlithm object mapping table 200. For example, as illustrated in FIG. 12A, the first portion 200a of the correlithm object mapping table 200 includes source correlithm objects 1-3 and the corresponding target correlithm objects 1-3. The second portion 200b includes a second subset of the source correlithm objects 104A and their corresponding target correlithm objects 104B from the entire correlithm object mapping table 200. For example, as illustrated in FIG. 12A, the second portion 200b includes source correlithm objects a-c and the corresponding target correlithm objects a-c. The n-th portion of the 200n includes an n-th subset of the source correlithm objects 104A and their corresponding target correlithm objects 104B from the entire correlithm object mapping table 200. For example, as illustrated in FIG. 12A, the n-th portion 200n includes source correlithm objects x-z and the corresponding target correlithm objects x-z. In some embodiments, the correlithm objects 104 included in the first, second, and n-th portions of the mapping table 200 are mutually exclusive of each other, or non-overlapping. In other embodiments, the correlithm objects 104 included in the first, second, and n-th portions of the mapping table 200 are overlapping or at least partially overlapping in order to achieve redundancy in the distance calculations between the input correlithm object 104 and the source correlithm objects 104A as detailed below.

The first, second, and n-th portions of mapping table 200 are each illustrated as having three source and target correlithm objects for illustrative purposes only. They may have any suitable number of correlithm objects 104 that may be the same or different from each other. In one embodiment, the number of correlithm objects 104 that are included in the first, second, and n-th portions of the mapping table 200 is determined based on the computing power of the corresponding final calculation nodes 1214a, 1214b, and 1214n, and/or the speed with which those nodes 1214a-n can perform their processes. For example, the more computing power and/or speed that a particular node 1214 can perform its processes, the larger number of correlithm objects 104 can be transmitted to that node 1214 in the relevant portion of the mapping table 200.

Distribution node 1202 transmits the first portion 200a of the correlithm object mapping table 200 to the first final calculation node 1214a, the second portion 200b to the second calculation node 1214b, and the n-th portion 200n to the n-th calculation node 1214n. After transmission, the first final calculation node 1214a stores, or otherwise has access to, the first portion 200a; the second calculation node 1214b stores, or otherwise has access to, the second portion 200b; and the n-th calculation node 1214n stores, or otherwise has access to, the n-th portion 200n. Although system 1210 is primarily described as having distribution node 1202 divide the mapping table 200 into portions 200a-n and transmit those portions 200a-n to corresponding final calculation nodes 1214a-n, it should be understood that the mapping table 200 can initially be created in multiple portions 200a-n and stored, or otherwise accessible by, calculation nodes 1214a-n without the need to divide the mapping table 200 and transmit the portions 200a-n by the distribution node 1202. Either approach achieves the technical advantages of parallel processing in computing the n-dimensional distances between the input correlithm object 104 and the source correlithm objects 104A in the portions 200a-n of the mapping table 200.

In operation, each of the intermediate calculation nodes 1212a-n receives an input correlithm object 104 (or at least a portion thereof). In the example described below, the input correlithm object 104 is a 256-bit digital word of binary values. Although FIG. 12A illustrates nodes 1212a-n receiving the input correlithm object 104 from distribution node 1202, nodes 1212a-n may receive input correlithm object 104 from any suitable sources including, but not limited to, distribution node 1202. The input correlithm object 104 is an n-bit digital word comprising binary values.

Each of the intermediate calculation nodes 1212a-n determines the n-dimensional distance (e.g., Hamming distance, Minkowski distance, or other suitable distance calculation) between the relevant bits of the input correlithm object 104 and the relevant portions 800a-n of the source correlithm objects 104A. For example, intermediate calculation node 1212a determines the n-dimensional distance between the first 64 bits of input correlithm object 104 and the first portion 800a of each source correlithm object 104, which in this example is also 64 bits. Thus, in the example illustrated in FIG. 12, first intermediate calculation node 1212a calculates nine n-dimensional distances, one each for the first portions 800a of source correlithm objects 1-3, source correlithm objects a-c, and source correlithm objects x-z. Similarly, second intermediate calculation node 1212b determines the n-dimensional distance between the next 64 bits of input correlithm object 104 and the second portion 800a of each source correlithm object 104, which in this example is also 64 bits. Thus, in the example illustrated in FIG. 12A, intermediate calculation node 1212b calculates nine n-dimensional distances, one each for the second portions 800b of source correlithm objects 1-3, source correlithm objects a-c, and source correlithm objects x-z. Finally, n-th intermediate calculation node 1212n determines the n-dimensional distance between the last 128 bits of input correlithm object 104 and the n-th portion 800n of each source correlithm object 104, which in this example is also 128 bits. Thus, in the example illustrated in FIG. 12A, intermediate calculation node 1212n calculates nine n-dimensional distances, one each for the n-th portions 800A of source correlithm objects 1-3, source correlithm objects a-c, and source correlithm objects x-z. With respect to calculating a Hamming distance, as described above with respect to at least FIG. 1, the determined n-dimensional distances are based on differences between the binary values representing the input correlithm object 104 and the binary values representing each of the portions 800a-n of the source correlithm objects.

Intermediate calculation nodes 1212a-n transmit the determined n-dimensional distance values to the final calculation nodes 1214a-n for further processing, as detailed below. In particular, first intermediate calculation node 1212a transmits the determined n-dimensional distances associated with the first portions 800a of the source correlithm objects 104A from the first portion 200a of the mapping table 200 to the first final calculation node 1214a. Intermediate calculation node 1212a further transmits the determined n-dimensional distances associated with the first portions 800a of the source correlithm objects 104A from the second portion 200b of the mapping table 200 to the second final calculation node 1214b. Intermediate calculation node 1212a transmits the determined n-dimensional distances associated with the first portions 800a of the source correlithm objects 104A from the n-th portion 200n of the mapping table 200 to the n-th final calculation node 1214n.

Similarly, intermediate calculation node 1212b transmits the determined n-dimensional distances associated with the second portions 800b of the source correlithm objects 104A from the first portion 200a of the mapping table 200 to the first final calculation node 1214a. Intermediate calculation node 1212b further transmits the determined n-dimensional distances associated with the second portions 800b of the source correlithm objects 104A from the second portion 200b of the mapping table 200 to the second final calculation node 1214b. Intermediate calculation node 1212b transmits the determined n-dimensional distances associated with the second portions 800b of the source correlithm objects 104A from the n-th portion 200n of the mapping table 200 to the n-th final calculation node 1214n.

Furthermore, intermediate calculation node 1212n transmits the determined n-dimensional distances associated with the n-th portions 800n of the source correlithm objects 104A from the first portion 200a of the mapping table 200 to the first final calculation node 1214a. Intermediate calculation node 1212n further transmits the determined n-dimensional distances associated with the n-th portions 800n of the source correlithm objects 104A from the second portion 200b of the mapping table 200 to the second final calculation node 1214b. Intermediate calculation node 1212n transmits the determined n-dimensional distances associated with the n-th portions 800n of the source correlithm objects 104A from the n-th portion 200n of the mapping table 200 to the n-th final calculation node 1214n.

The final calculation nodes 1214a-n receive the n-dimensional distance calculations described above from the various intermediate calculation nodes 1212a-n. The final calculation nodes 1214a-n also store, or otherwise have access to, the mapping tables 200. The first final calculation node 1214a adds the n-dimensional distance calculations received from each of the intermediate calculation nodes 1212a-n for each source correlithm object 104A in the first portion 200a of the mapping table 200. For example, first final calculation node 1214a adds together the n-dimensional distance determined for the first portion 800a of source correlithm object 1 with the n-dimensional distance determined for the second portion 800a of source correlithm object 1 and the n-dimensional distance determined for the n-th portion 800n of source correlithm object 1 to determine an aggregate n-dimensional distance for source correlithm object 1. Likewise, first final calculation node 1214a adds together the n-dimensional distances for the first portion 800a, second portion 800*b*, and n-th portion 800*n* of source correlithm object 2 to determine an aggregate n-dimensional distance for source correlithm object 2. Furthermore, first final calculation node 1214*a* adds together the n-dimensional distances for the first portion 800*a*, second portion 800*b*, and n-th portion 800*n* of source correlithm object 3 to determine an aggregate n-dimensional distance for source correlithm object 3. In a particular embodiment, these n-dimensional distances may be represented as Hamming distances and added together as such. In other embodiments, they may be Minkowski distances, or any other suitable form of measurement for n-dimensional distances.

First final calculation node 1214*a* then compares the determined n-dimensional distances to identify the source correlithm object 104A from the first portion 200*a* of the mapping table 200 with the smallest n-dimensional distance to the input correlithm object 104. For example, if the n-dimensional distances are measured using Hamming distances, then first final calculation node 1214*a* will compare the aggregate Hamming distances calculated for each of the three source correlithm objects 1-3 to each other, to determine which source correlithm object 104A from the first portion 200*a* of the mapping table 200 has the smallest Hamming distance. First final calculation node 1214*a* then identifies the target correlithm object 104B that corresponds to the identified source correlithm object 104A with the smallest n-dimensional distance to the input correlithm object 104, and communicates that target correlithm object 104B and the smallest determined n-dimensional distance calculation to the resolution node 1206. In a particular embodiment, first final calculation node 1214*a* stores a copy of the mapping table 200 so it can look up which target correlithm object 104B corresponds to the identified source correlithm object 104A.

The second final calculation node 1214*b* adds the n-dimensional distance calculations received from each of the intermediate calculation nodes 1212*a-n* for each source correlithm object 104A in the second portion 200*b* of the mapping table 200. For example, second final calculation node 1214*b* adds together the n-dimensional distance determined for the first portion 800*b* of source correlithm object a with the n-dimensional distance determined for the second portion 800*a* of source correlithm object a and the n-dimensional distance determined for the n-th portion 800*n* of source correlithm object a to determine an aggregate n-dimensional distance for source correlithm object a. Likewise, second final calculation node 1214*b* adds together the n-dimensional distances for the first portion 800*a*, second portion 800*b*, and n-th portion 800*n* of source correlithm object b to determine an aggregate n-dimensional distance for source correlithm object b. Furthermore, second final calculation node 1214*b* adds together the n-dimensional distances for the first portion 800*a*, second portion 800*b*, and n-th portion 800*n* of source correlithm object c to determine an aggregate n-dimensional distance for source correlithm object c. In a particular embodiment, these n-dimensional distances may be represented as Hamming distances and added together as such. In other embodiments, they may be Minkowski distances, or any other suitable form of measurement for n-dimensional distances.

Second final calculation node 1214*b* then compares the determined n-dimensional distances to identify the source correlithm object 104A from the second portion 200*b* of the mapping table 200 with the smallest n-dimensional distance to the input correlithm object 104. For example, if the n-dimensional distances are measured using Hamming distances, then second final calculation node 1214*b* will compare the aggregate Hamming distances calculated for each of the three source correlithm objects a-c to each other, to determine which source correlithm object 104A from the second portion 200*b* of the mapping table 200 has the smallest Hamming distance. Second final calculation node 1214*b* then identifies the target correlithm object 104B that corresponds to the identified source correlithm object 104A with the smallest n-dimensional distance to the input correlithm object 104, and communicates that target correlithm object 104B and the smallest determined n-dimensional distance calculation to the resolution node 1206. In a particular embodiment, second final calculation node 1214*b* stores a copy of the mapping table 200 so it can look up which target correlithm object 104B corresponds to the identified source correlithm object 104A.

The n-th final calculation node 1214*n* adds the n-dimensional distance calculations received from each of the intermediate calculation nodes 1212*a-n* for each source correlithm object 104A in the n-th portion 200*n* of the mapping table 200. For example, n-th final calculation node 1214*n* adds together the n-dimensional distance determined for the first portion 800*a* of source correlithm object x with the n-dimensional distance determined for the second portion 800*b* of source correlithm object x and the n-dimensional distance determined for the n-th portion 800*n* of source correlithm object x to determine an aggregate n-dimensional distance for source correlithm object x. Likewise, n-th final calculation node 1214*n* adds together the n-dimensional distances for the first portion 800*a*, second portion 800*b*, and n-th portion 800*n* of source correlithm object y to determine an aggregate n-dimensional distance for source correlithm object y. Furthermore, n-th final calculation node 1214*n* adds together the n-dimensional distances for the first portion 800*a*, second portion 800*b*, and n-th portion 800*n* of source correlithm object z to determine an aggregate n-dimensional distance for source correlithm object z. In a particular embodiment, these n-dimensional distances may be represented as Hamming distances and added together as such. In other embodiments, they may be Minkowski distances, or any other suitable form of measurement for n-dimensional distances.

N-th final calculation node 1214*n* then compares the determined n-dimensional distances to identify the source correlithm object 104A from the n-th portion 200*n* of the mapping table 200 with the smallest n-dimensional distance to the input correlithm object 104. For example, if the n-dimensional distances are measured using Hamming distances, then n-th final calculation node 1214*n* will compare the aggregate Hamming distances calculated for each of the three source correlithm objects x-z to each other, to determine which source correlithm object 104A from the n-th portion 200*n* of the mapping table 200 has the smallest Hamming distance. N-th final calculation node 1214*n* then identifies the target correlithm object 104B that corresponds to the identified source correlithm object 104A with the smallest n-dimensional distance to the input correlithm object 104, and communicates that target correlithm object 104B and the smallest determined n-dimensional distance calculation to the resolution node 1206. In a particular embodiment, n-th final calculation node 1214*n* stores a copy of the mapping table 200 so it can look up which target correlithm object 104B corresponds to the identified source correlithm object 104A.

Resolution node 1206 then compares the n-dimensional distances received from the final calculation nodes 1214*a-n* with each other to identify the smallest n-dimensional distance. Resolution node 1206 then identifies the target correlithm object 104B associated with the smallest determined n-dimensional distance and outputs the identified target correlithm object 104B as output correlithm object 104.

By dividing the source correlithm objects 104A in mapping table 200 into smaller portions 800a-n, and by further dividing the mapping table 200 into smaller portions 200a-b, the process of determining the n-dimensional distances between the input correlithm object 104 and the source correlithm objects 104 is performed in parallel by intermediate calculation nodes 1212a-n and final calculation nodes 1214a. Performing parallel processing, as described above, increases the speed and efficiency of calculating the n-dimensional distances between the input correlithm object 104 and the source correlithm objects 104A of the mapping table 200. This reduces bottlenecks in the network and in the overall correlithm object processing system 1210.

Although system 1210 is described with respect to dividing each source correlithm object into portions 800a-n and dividing mapping table 200 into portions 200a-n, it should be understood that system 1210 can be implemented using a multi-input mapping table 200 having multiple source correlithm objects 104A corresponding to each target correlithm object 104B, as described in FIG. 9A. In this embodiment, intermediate calculation nodes 1212a-n operate on plurality of source correlithm objects 900a-n (as explained in conjunction with FIG. 9A) and input correlithm objects 104a-n rather than on portions of a given source correlithm object 800a-n and corresponding portions of an input correlithm object 104. The mapping table 200 is still divided into portions 200a-n and the final calculation nodes 1214a-n still operate on those portions 200a-n, as described above for system 1210.

FIG. 12B illustrates an embodiment of correlithm object processing system 1210 that operates in conjunction with an actor table 310 rather than a correlithm object mapping table 200. In this embodiment, actor table 310 is configured with a first column 202 that includes target correlithm objects 104B and a second column 204 that includes real world data values. The operation of system 1210 in FIG. 12B is substantially similar to that of system 1210 in FIG. 12A except that distribution node 1202, intermediate calculation nodes 1212a-n, final calculation nodes 1214a-n, and resolution node 1206 operate using target correlithm objects 104B from actor table 310 in place of source correlithm objects 104A from mapping table 200, and they operate using real world data values from actor table 310 in place of target correlithm objects 104B from mapping table 200.

Figure 13A:
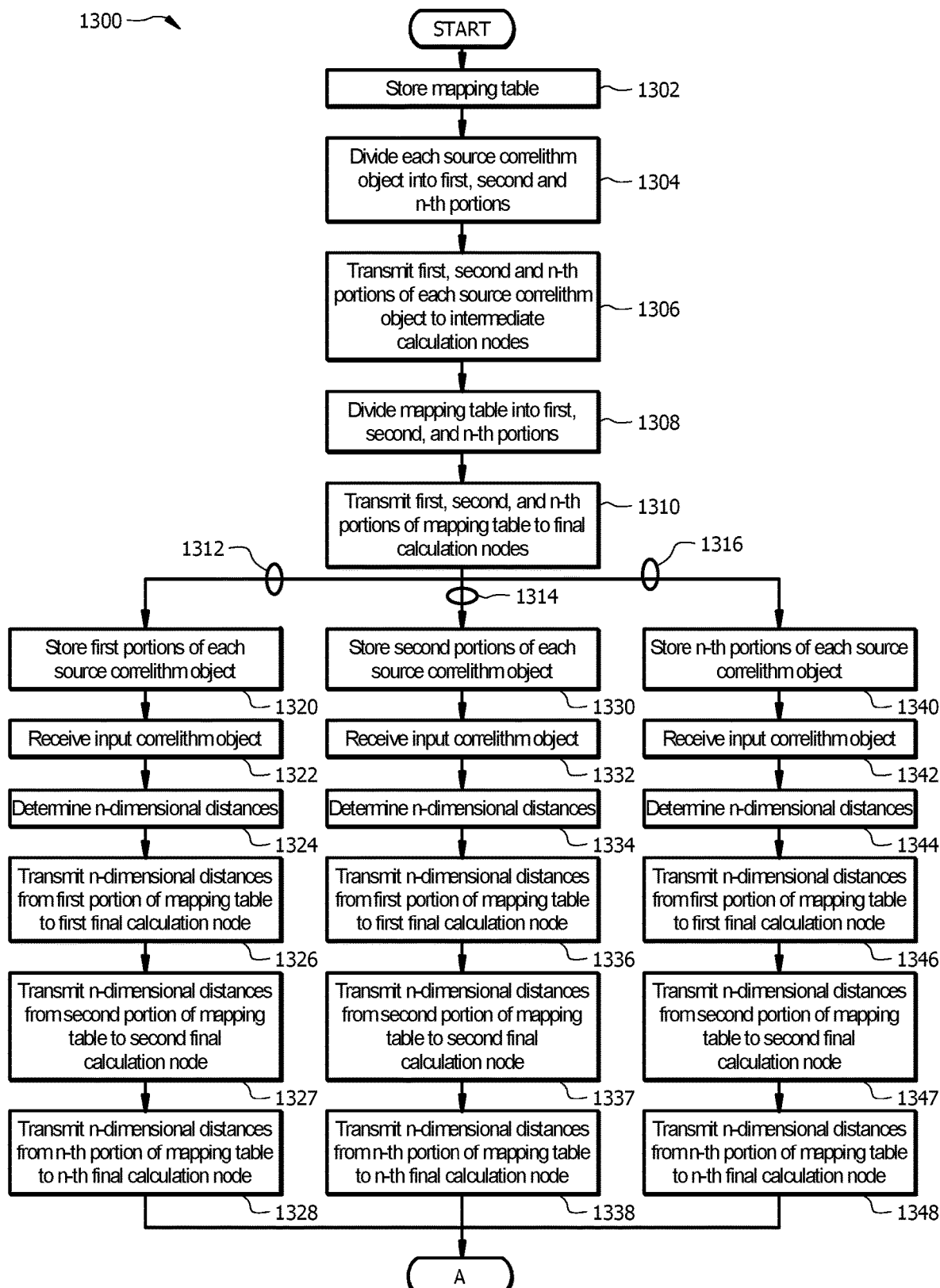
FIGS. 13A-B illustrates one embodiment of a flowchart implementing a process performed by the components of the correlithm object processing system illustrated in FIGS. 12A-B.
Figure 13B:
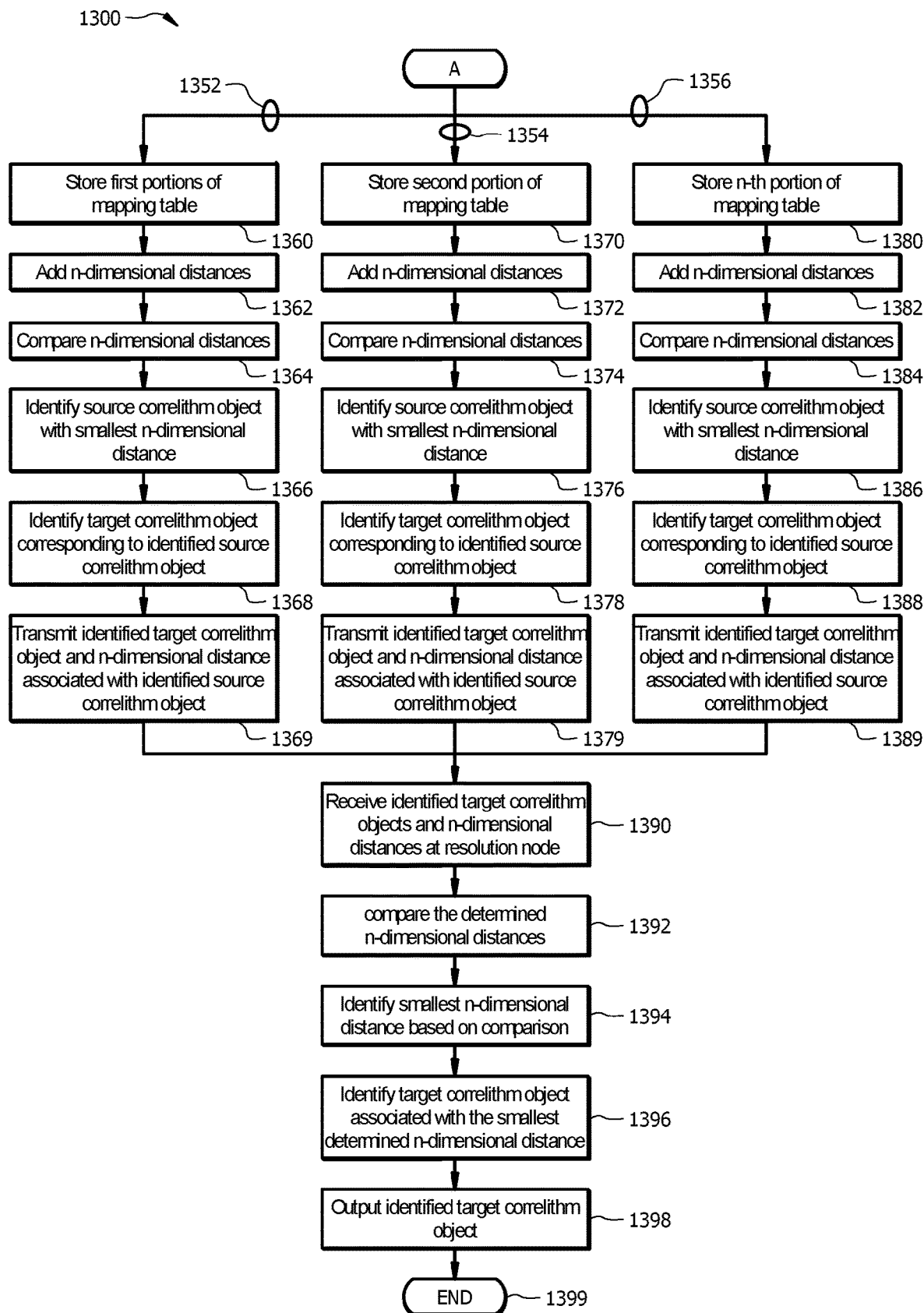

FIGS. 13A-B illustrate one embodiment of a flowchart 1300 implementing a process performed by the components of correlithm object processing system 1210. Upon starting the process, distribution node 1202 stores correlithm object mapping table 200 at step 1302. Mapping table 200 includes source correlithm objects 104A mapped to target correlithm objects 104B. Distribution node 1202 divides each source correlithm object 104A into any suitable number of portions, such as first portion 800a, second portion 800b, and n-th portion 800n, at step 1304. Each portion 800a-n comprises a subset of the binary values in that source correlithm object 104A. Execution proceeds to step 1306, where distribution node 1202 transmits the first portion 800a to first intermediate calculation node 1212a; transmits the second portion 800b to second intermediate calculation node 1212b; and transmits the n-th portion 800n to n-th intermediate calculation node 1212n. At step 1308, distribution node 1202 divides mapping table 200 into any suitable number of portions, such as a first portion 200a, a second portion 200b, and an n-th portion 200n. Each portion 200a-n comprises a subset of the binary values in that source correlithm object 104A. Execution proceeds to step 1310, where distribution node 1202 transmits the first portion 200a to first final calculation node 1214a; transmits the second portion 200b to second final calculation node 1214b; and transmits the n-th portion 200n to n-th final calculation node 1214n.

Execution proceeds in parallel according to processing path 1312 associated with first intermediate calculation node 1212a, path 1314 associated with second intermediate calculation node 1212b, and path 1316 associated with n-th intermediate calculation node 1212n. Notwithstanding the ordering of discussion with respect to the flowchart illustrated in FIGS. 13A-B, the processes described in each of the paths 1312, 1314, and 1316 are performed substantially simultaneously.

Referring to processing path 1312, execution proceeds to step 1320 where first intermediate calculation node 1212a stores first portion 800a of each source correlithm object 104A from mapping table 200. First intermediate calculation node 1212a receives input correlithm object 104 at step 1322. Execution proceeds to step 1324 where first intermediate calculation node 1212a determines n-dimensional distances between the input correlithm object 104 and the first portion 800a of each source correlithm object 104A from mapping table 200. The determined n-dimensional distances are based on differences between the binary values representing the input correlithm object 104 and the binary values representing the first portion 800a of each source correlithm object 104A from mapping table 200. At step 1326, first intermediate calculation node 1212a transmits to first final calculation node 1214a the determined n-dimensional distances for the first portions 800a of the source correlithm objects 104A from the first portion 200a of mapping table 200. At step 1327, first intermediate calculation node 1212a transmits to second final calculation node 1214b the determined n-dimensional distances for the first portions 800a of the source correlithm objects 104A from the second portion 200b of mapping table 200. At step 1328, first intermediate calculation node 1212a transmits to n-th final calculation node 1214n the determined n-dimensional distances for the first portions 800a of the source correlithm objects 104A from the n-th portion 200n of mapping table 200.

Referring to processing path 1314, execution proceeds to step 1330 where second intermediate calculation node 1212b stores second portion 800b of each source correlithm object 104A from mapping table 200. Second intermediate calculation node 1212b receives input correlithm object 104 at step 1332. Execution proceeds to step 1334 where second intermediate calculation node 1212b determines n-dimensional distances between the input correlithm object 104 and the second portion 800b of each source correlithm object 104A from mapping table 200. The determined n-dimensional distances are based on differences between the binary values representing the input correlithm object 104 and the binary values representing the second portion 800b of each source correlithm object 104A from mapping table 200. At step 1336, second intermediate calculation node 1212b transmits to first final calculation node 1214a the determined n-dimensional distances for the second portions 800b of the source correlithm objects 104A from the first portion 200a of mapping table 200. At step 1337, second intermediate calculation node 1212a transmits to second final calculation node 1214b the determined n-dimensional distances for the second portions 800b of the source correlithm objects 104A from the second portion 200b of mapping table 200. At step 1338, second intermediate calculation node 1212b transmits to n-th final calculation node 1214n the determined n-dimensional distances for the second portions 800b of the source correlithm objects 104A from the n-th portion 200n of mapping table 200.

Referring to processing path 1316, execution proceeds to step 1340 where n-th intermediate calculation node 1212n stores n-th portion 800n of each source correlithm object 104A from mapping table 200. N-th intermediate calculation node 1212n receives input correlithm object 104 at step 1342. Execution proceeds to step 1344 where n-th intermediate calculation node 1212n determines n-dimensional distances between the input correlithm object 104 and the n-th portion 800n of each source correlithm object 104A from mapping table 200. The determined n-dimensional distances are based on differences between the binary values representing the input correlithm object 104 and the binary values representing the n-th portion 800n of each source correlithm object 104A from mapping table 200. At step 1346, n-th intermediate calculation node 1212n transmits to first final calculation node 1214a the determined n-dimensional distances for the n-th portions 800n of the source correlithm objects 104A from the first portion 200a of mapping table 200. At step 1347, n-th intermediate calculation node 1212n transmits to second final calculation node 1214b the determined n-dimensional distances for the n-th portions 800n of the source correlithm objects 104A from the second portion 200b of mapping table 200. At step 1348, n-th intermediate calculation node 1212n transmits to n-th final calculation node 1214n the determined n-dimensional distances for the n-th portions 800n of the source correlithm objects 104A from the n-th portion 200n of mapping table 200.

Execution proceeds in parallel from paths 1312, 1314, and 1316 to path 1352 associated with first final calculation node 1214a, path 1354 associated with second final calculation node 1214b, and path 1356 associated with n-th final calculation node 1214n. Notwithstanding the ordering of discussion with respect to the flowchart illustrated in FIGS. 13A-B, the processes described in each of the paths 1352, 1354, and 1356 are performed substantially simultaneously.

Referring to path 1352, execution proceeds to step 1360 where first final calculation node 1214a stores (or otherwise has access to) mapping table 200. At step 1362, for each source correlithm object 104A in the first portion 200a of the mapping table 200, first final calculation node 1214a adds together the n-dimensional distances determined for the portions 800a-n of that source correlithm object 104a. Thus, for example, first final calculation node 1214a adds together the n-dimensional distance determined for the first portion 800a of source correlithm object 1 with the n-dimensional distance determined for the second portion 800b of the source correlithm object 1 and the n-dimensional distance determined for the n-th portion 800n of the source correlithm object 1. First final calculation node 1214a also adds together the n-dimensional distance determined for the first portion 800a of the source correlithm object 2 with the n-dimensional distance determined for the second portion 800b of the source correlithm object 2 and the n-dimensional distance determined for the n-th portion 800n of the source correlithm object 2. First final calculation node 1214a also adds together the n-dimensional distance determined for the first portion 800a of the source correlithm object 3 with the n-dimensional distance determined for the second portion 800b of the source correlithm object 3 and the n-dimensional distance determined for the n-th portion 800n of the source correlithm object 3.

Execution proceeds to step 1364, where first final calculation node 1214a compares the n-dimensional distances determined at step 1362 to each other to find the smallest determined n-dimensional distance. At step 1366, first final calculation node 1214a identifies the source correlithm object 104A corresponding to the smallest n-dimensional distance determined at step 1364. This identified source correlithm object is the closest match to the input correlithm object 104 among all of the source correlithm objects 104A in the first portion 200a of mapping table 200. At step 1368, first final calculation node 1214a then refers to the mapping table 200 to identify the target correlithm object 104B associated with the source correlithm object 104A identified at step 1366. At step 1369, first final calculation node 1214a transmits to resolution node 1306 the target correlithm object 104B identified at step 1368 and the smallest n-dimensional distance determined at step 1364.

Referring to path 1354, execution proceeds to step 1370 where second final calculation node 1214b stores (or otherwise has access to) mapping table 200. At step 1372, for each source correlithm object 104A in the second portion 200b of the mapping table 200, second final calculation node 1214b adds together the n-dimensional distances determined for the portions 800a-n of that source correlithm object 104a. Thus, for example, second final calculation node 1214b adds together the n-dimensional distance determined for the first portion 800a of source correlithm object a with the n-dimensional distance determined for the second portion 800b of the source correlithm object a and the n-dimensional distance determined for the n-th portion 800n of the source correlithm object a. Second final calculation node 1214b also adds together the n-dimensional distance determined for the first portion 800a of the source correlithm object b with the n-dimensional distance determined for the second portion 800b of the source correlithm object b and the n-dimensional distance determined for the n-th portion 800n of the source correlithm object b. Second final calculation node 1214b also adds together the n-dimensional distance determined for the first portion 800a of the source correlithm object c with the n-dimensional distance determined for the second portion 800b of the source correlithm object c and the n-dimensional distance determined for the n-th portion 800n of the source correlithm object c.

Execution proceeds to step 1374, where second final calculation node 1214b compares the n-dimensional distances determined at step 1372 to each other to find the smallest determined n-dimensional distance. At step 1376, second final calculation node 1214b identifies the source correlithm object 104A corresponding to the smallest n-dimensional distance determined at step 1374. This identified source correlithm object is the closest match to the input correlithm object 104 among all of the source correlithm objects 104A in the second portion 200b of mapping table 200. At step 1378, second final calculation node 1214b then refers to the mapping table 200 to identify the target correlithm object 104B associated with the source correlithm object 104A identified at step 1376. At step 1379, second final calculation node 1214b transmits to resolution node 1306 the target correlithm object 104B identified at step 1378 and the smallest n-dimensional distance determined at step 1374.

Referring to path 1356, execution proceeds to step 1380 where n-th final calculation node 1214n stores (or otherwise has access to) mapping table 200. At step 1382, for each source correlithm object 104A in the n-th portion 200n of the mapping table 200, n-th final calculation node 1214n adds together the n-dimensional distances determined for the portions 800a-n of that source correlithm object 104a. Thus, for example, n-th final calculation node 1214n adds together the n-dimensional distance determined for the first portion 800a of source correlithm object x with the n-dimensional distance determined for the second portion 800b of the source correlithm object x and the n-dimensional distance determined for the n-th portion 800n of the source correlithm object x. N-th final calculation node 1214n also adds together the n-dimensional distance determined for the first portion 800a of the source correlithm object y with the n-dimensional distance determined for the second portion 800b of the source correlithm object y and the n-dimensional distance determined for the n-th portion 800n of the source correlithm object y. N-th final calculation node 1214n also adds together the n-dimensional distance determined for the first portion 800a of the source correlithm object z with the n-dimensional distance determined for the second portion 800b of the source correlithm object z and the n-dimensional distance determined for the n-th portion 800n of the source correlithm object z.

Execution proceeds to step 1384, where n-th final calculation node 1214n compares the n-dimensional distances determined at step 1382 to each other to find the smallest determined n-dimensional distance. At step 1386, n-th final calculation node 1214n identifies the source correlithm object 104A corresponding to the smallest n-dimensional distance determined at step 1384. This identified source correlithm object is the closest match to the input correlithm object 104 among all of the source correlithm objects 104A in the n-th portion 200n of mapping table 200. At step 1388, n-th final calculation node 1214n then refers to the mapping table 200 to identify the target correlithm object 104B associated with the source correlithm object 104A identified at step 1386. At step 1389, n-th final calculation node 1214n transmits to resolution node 1306 the target correlithm object 104B identified at step 1388 and the smallest n-dimensional distance determined at step 1384.

Execution proceeds from paths 1352, 1354, and 1356 to step 1390, where resolution node 1306 receives the target correlithm objects 104B and n-dimensional distances communicated by the final calculation nodes 1214a-n. At step 1392, resolution node 1306 compares the n-dimensional distances transmitted by the first final calculation node 1214a, the second final calculation node 1214b, and the n-th calculation node 1214n to each other. At step 1394, resolution node 1206 identifies the smallest n-dimensional distance based on the comparison performed at step 1392. Execution proceeds to step 1396, where resolution node 1206 identifies the target correlithm object 104B associated with the smallest n-dimensional distance determined at step 1394. At step 1398, resolution node 1206 outputs the target correlithm object 104B identified at step 1396. Execution terminates at step 1399.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A distributed node network configured to emulate a correlithm object processing system, comprising:
    a distribution node configured to store a correlithm object mapping table that comprises a plurality of source correlithm objects and a plurality of corresponding target correlithm objects, wherein:
        the distribution node is configured to divide the correlithm object mapping table into at least a first portion and a second portion;
        each source correlithm object comprises a n-bit digital word of binary values; and
        each target correlithm object comprises a n-bit digital word of binary values;
    a first calculation node communicatively coupled to the distribution node and configured to store the first portion of the mapping table, the first portion of the mapping table comprising a first subset of the source correlithm objects and their corresponding target correlithm objects; and
    a second calculation node communicatively coupled to the distribution node and configured to store the second portion of the mapping table, the second portion of the mapping table comprising a second subset of the source correlithm objects and their corresponding target correlithm objects, wherein at least some of the first subset of source correlithm objects and their corresponding target correlithm objects are different from the second subset of the source correlithm objects and their corresponding target correlithm objects;
    wherein:
    the size of the first portion of the mapping table is based at least in part upon a processing power of the first calculation node;
    the size of the second portion of the mapping table is based at least in part upon a processing power of the second calculation node; and
    one or more of the nodes quantify a degree of similarity between (a) different data samples having the same or different data types and/or formats, (b) different facial images, or (c) different images of people, by:
        using the results of the emulation;
        computing n-dimensional distances between data samples; and
        performing non-binary comparisons between data samples using categorical numbers;
    wherein the degree of similarity indicates how similar the different data samples are to each other.

2. The distributed node network of claim 1, wherein the distribution node is further configured to:
    transmit the first portion of the mapping table to the first calculation node; and
    transmit the second portion of the mapping table to the second calculation node.

3. The distributed node network of claim 1, wherein the distribution node is further configured to divide the correlithm object mapping table into a n-th portion of the mapping table, the n-th portion of the mapping table comprising a n-th subset of the source correlithm objects and their corresponding target correlithm objects.

4. The distributed node network of claim 3, further comprising a n-th calculation node communicatively coupled to the distribution node, the n-th calculation node configured to store the n-th portion of the mapping table.

5. The distributed node network of claim 1, wherein:
the distribution node stores an actor table that comprises a plurality of target correlithm objects and a plurality of corresponding real world value entries;
the distribution node is configured to divide the actor table into at least a first portion and a second portion;
a third calculation node configured to store the first portion of the actor table, the first portion of the actor table comprising a first subset of the target correlithm objects and their corresponding real world value entries;
a fourth calculation node configured to store the second portion of the actor table, the second portion of the actor table comprising a second subset of the target correlithm objects and their corresponding real world value entries; and
at least some of the first subset of the target correlithm objects and their corresponding real world value entries are different from the second subset of the target correlithm objects and their corresponding real world value entries.

6. The distributed node network of claim 1, wherein the first calculation node and the second calculation node execute simultaneously on separate processors.

7. The distributed node network of claim 1, wherein the first and second calculation nodes implement parallel processing to reduce network latency.

8. A method for emulating a correlithm object processing system in a distributed node network, the method comprising:
storing a correlithm object mapping table in a distribution node, wherein:
the correlithm object mapping table comprises a plurality of source correlithm objects and a plurality of corresponding target correlithm objects;
each source correlithm object comprises a n-bit digital word of binary values; and
each target correlithm object comprises a n-bit digital word of binary values;
dividing the correlithm object mapping table into at least a first portion and a second portion;
storing the first portion of the mapping table in a first calculation node communicatively coupled to the distribution node, the first portion of the mapping table comprising a first subset of the source correlithm objects and their corresponding target correlithm objects;
storing the second portion of the mapping table in a second calculation node communicatively coupled to the distribution node, the second portion of the mapping table comprising a second subset of the source correlithm objects and their corresponding target correlithm objects, wherein at least some of the first subset of source correlithm objects and their corresponding target correlithm objects are different from the second subset of the source correlithm objects and their corresponding target correlithm objects;

wherein:
the size of the first portion of the mapping table is based at least in part upon a processing power of the first calculation node; and
the size of the second portion of the mapping table is based at least in part upon a processing power of the second calculation node; and
quantifying a degree of similarities
between (a) different data samples having the same or different data types and/or formats, (b) different facial images, or (c) different images of people, by:
using the results of the emulation;
computing n-dimensional distances between data samples; and
performing non-binary comparisons between data samples using categorical numbers;
wherein the degree of similarity indicates how similar the different data samples are to each other.

9. The method of claim 8, further comprising:
transmitting the first portion of the mapping table to the first calculation node; and
transmitting the second portion of the mapping table to the second calculation node.

10. The method of claim 8, further comprising dividing the correlithm object mapping table into a n-th portion of the mapping table, the n-th portion of the mapping table comprising a n-th subset of the source correlithm objects and their corresponding target correlithm objects.

11. The method of claim 10, further comprising:
transmitting the n-th portion of the mapping table to a n-th calculation node communicatively coupled to the distribution node; and
storing the n-th portion of the mapping table in the n-th calculation node.

12. The method of claim 8, further comprising:
storing an actor table that comprises a plurality of target correlithm objects and a plurality of corresponding real world value entries;
dividing the actor table into at least a first portion and a second portion;
storing the first portion of the actor table at the first calculation node, the first portion of the actor table comprising a first subset of the target correlithm objects and their corresponding real world value entries; and
storing the second portion of the actor table at the second calculation node, the second portion of the actor table comprising a second subset of the target correlithm objects and their corresponding real world value entries;
wherein at least some of the first subset of the target correlithm objects and their corresponding real world value entries are different from the second subset of the target correlithm objects and their corresponding real world value entries.

13. The method of claim 8, wherein the first calculation node and the second calculation node execute simultaneously on separate processors.

14. The method of claim 8, wherein the first and second calculation nodes implement parallel processing to reduce network latency.

15. A distributed node network configured to emulate a correlithm object processing system, comprising:
a first calculation node configured to store a first portion of a correlithm object mapping table, wherein:
the mapping table comprises a plurality of source correlithm objects and a plurality of corresponding target correlithm objects;

each source correlithm object comprises a n-bit digital word of binary values;

each target correlithm object comprises a n-bit digital word of binary values; and the first portion of the mapping table comprising a first subset of the source correlithm objects and their corresponding target correlithm objects;

and a second calculation node configured to store a second portion of the mapping table, the second portion of the mapping table comprising a second subset of the source correlithm objects and their corresponding target correlithm objects, wherein at least some of the first subset of source correlithm objects and their corresponding target correlithm objects are different from the second subset of the source correlithm objects and their corresponding target correlithm objects;

wherein:

the size of the first portion of the mapping table is based at least in part upon a processing power of the first calculation node;

the size of the second portion of the mapping table is based at least in part upon a processing power of the second calculation node; and one or more of the nodes quantify a degree of similarity between (a) different data samples having the same or different data types and/or formats, (b) different facial images, or (c) different images of people, by:

using the results of the emulation;

computing n-dimensional distances between data samples; and performing non-binary comparisons between data samples using categorical numbers;

wherein the degree of similarity indicates how similar the different data samples are to each other.

16. The distributed node network of claim 15, further comprising a n-th calculation node configured to store the n-th portion of the mapping table.

17. The distributed node network of claim 15, wherein the first calculation node and the second calculation node execute simultaneously on separate processors.

* * * * *